(12) United States Patent
Ström et al.

(10) Patent No.: US 9,794,591 B2
(45) Date of Patent: Oct. 17, 2017

(54) CODING AND DECODING OF TRANSFORM SKIPPED BLOCKS

(71) Applicant: Telefonaktiebolaget LM Ericsson (publ), Stockholm (SE)

(72) Inventors: Jacob Ström, Stockholm (SE); Kenneth Andersson, Gävle (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 15/415,536

(22) Filed: Jan. 25, 2017

(65) Prior Publication Data
US 2017/0134751 A1    May 11, 2017

Related U.S. Application Data

(63) Continuation of application No. 14/432,532, filed as application No. PCT/EP2013/070311 on Sep. 30, 2013.

(60) Provisional application No. 61/708,212, filed on Oct. 1, 2012.

(51) Int. Cl.
| | | |
|---|---|---|
| H04N 19/00 | (2014.01) |
| H04N 19/60 | (2014.01) |
| H04N 19/13 | (2014.01) |
| H04N 19/139 | (2014.01) |
| H04N 19/176 | (2014.01) |
| H04N 19/547 | (2014.01) |

(52) U.S. Cl.
CPC ............ *H04N 19/60* (2014.11); *H04N 19/13* (2014.11); *H04N 19/139* (2014.11); *H04N 19/176* (2014.11); *H04N 19/547* (2014.11)

(58) Field of Classification Search
CPC ......... H04N 19/21; H04N 19/13; H04N 19/44
USPC ..................................................... 375/240.02
See application file for complete search history.

(56) References Cited

PUBLICATIONS

An, Jicheng et al., "Residue scan for intra transform skip mode", Joint Collaborative Team on Video Coding (JCT-VC) of ITU-T SG 16 WP 3 and ISO/IEC JTC 1/SC 29/WG11, Document JCTVC-J0053, Stockholm, SE, Jul. 11-20, 2012, 1-5.

Bross, Benjamin et al., "High efficiency video coding (HEVC) text specification draft 7", Joint Collaborative Team on Video Coding (JCT-VC) of ITU-T SG16 WP3 and ISO/IEC JTC1/SC29/WG11, Document JCTVC-I1003A1 , 9th Meeting, Geneva, CH, Apr. 27-May 7, 2012, 1-273.

Bross, Benjamin et al., "High efficiency video coding (HEVC) text specification draft 7", Joint Collaborative Team on Video Coding (JCT-VC) of ITU-T SG16 WP3 and ISO/IEC JTC1/SC29/WG11, Document JCTVC-I1003_d4, (th Meeting, Geneva, CH, 27 Apr. 27- May 7, 2012, 1-297.

Marpe, Detlev et al., "Context-Based Adaptive Binary Arithmetic Coding in the H.264/AVC Video Compression Standard", IEEE Transactions on Circuits and Systems for Video Technology, vol. 13, No. 7, Jul. 2003, 620-636.

Tsukuba, Takeshi, "Constant coefficient context for intra transform skipping", Joint Collaborative Team on Video Coding (JCT-VC) of ITU-T SG 16 WP 3 and ISO/IEC JTC1/SC 29/WG 11, Document JCTVC-J0069r3, 10th Meeting, Stockholm, SE, Jul. 11-20, 2012, 1-8.

*Primary Examiner* — Jeffery Williams
(74) *Attorney, Agent, or Firm* — Murphy, Bilak & Homiller, PLLC

(57) ABSTRACT

Video encoder and decoder and methods therein for transform skipped encoding and decoding of blocks of pixels. The methods comprise a modified use of an existing context model associated with transform coefficients, for deriving contexts for a bitmask indicating which residual values (i.e., not transform coefficients), in a transform skipped residual block, that are greater than one. The methods are applicable to video coding schemes such as HEVC.

12 Claims, 10 Drawing Sheets

Starting position

CODING AND DECODING OF TRANSFORM SKIPPED BLOCKS

TECHNICAL FIELD

The solution described herein relates to video coding and in particular to transform skip blocks in residual coding.

BACKGROUND

High Efficiency Video Coding (HEVC) is a new video coding standard currently being developed in Joint Collaborative Team-Video Coding (JCT-VC). JCT-VC is a collaborative project between MPEG and ITU-T. Currently, a Draft International Standard (DIS) is defined that includes a number of new tools which makes HEVC considerably more efficient than H.264/AVC.

Residual Coding in HEVC

HEVC is a hybrid codec that uses previously transmitted pictures as reference pictures. In inter coding, pixels from these previously transmitted pictures are used to predict the content in the current picture. In intra coding, already transmitted pixels in the same image are used to predict the pixels in the current block. We will describe intra coding in more detail. The left diagram in FIG. 1 shows the 4×4 pixels that are to be coded. Since the blocks are sent in a left-to-right, top-to-bottom order, the pixels above and to the left of the block have already been encoded and transmitted. The surrounding pixels are shown to the right in FIG. 1, where the 4×4 pixels to be coded are illustrated in white.

A prediction direction is also transmitted. As shown in the left diagram in FIG. 2, the chosen prediction direction is diagonal in this particular example. In the right diagram in FIG. 2, the result of the diagonal prediction may be seen. The predicted block to the right in FIG. 2 is not exactly the same as the original block illustrated to the left in FIG. 1, but it is quite close.

FIG. 3 illustrates the prediction error or difference between the original block and the prediction. This may also be denoted the residual or a residual block. In this particular example, the prediction was very accurate near the predicting pixels, and the error there is zero. Note that the error is larger in the bottom right corner. This is typical in intra prediction, since those pixels are furthest from the pixels used for prediction, and prediction gets harder the further away from the known pixels it gets. In inter prediction the prediction error typically do not have any specific part of the residual block with larger error than any other parts of the residual block.

The next step is to transform this residual block. The transform is done with a DCT-like transform, resulting in a block of transform coefficients. An example of a transformed block is shown in the left diagram in FIG. 4. Note that the illustrated values are not mathematically correct, but are used for illustrative purposes. The diagram to the right in FIG. 4 illustrates a diagonal scanning order applied on the transform block.

After the transform, the largest values are typically in the top left corner, which may be seen in FIG. 4. This is typically the case for both inter and intra prediction. The coefficients in the upper left corner represent low frequencies. The reason why these are typically bigger is due to the fact that most images, and most residual images, have low frequency behavior. The transform coefficients are quantized, and the block is scanned. The goal with the scanning is to get as many zeros as possible in consecutive order. As is shown in the right diagram in FIG. 4, selecting a scanning order that scans the pixels diagonally starting with the bottom right pixel will almost sort the coefficients in increasing order and thus create a long run of zeros. Other scan directions used in intra block coefficient coding are horizontal scan and vertical scan, which are illustrated in FIG. 5.

In HEVC, the scan direction is mode dependent for intra for transform block size 4×4 and 8×8. DC and planar prediction and blocks that are predicted in a diagonal direction uses diagonal scan, blocks predicted in a direction more biased to prediction in a vertical direction use horizontal scan and blocks predicted in a direction more biased to prediction in a horizontal direction use vertical scan. Larger transform blocks of intra predicted blocks and all inter predicted transform blocks always use diagonal scan.

The scanned coefficients are then transmitted. To exploit the fact that there typically is a lot of zeros in the beginning, the encoder transmits the position of the last nonzero coefficient with origin at top left corner. The origin is at the DC coefficient position in HEVC and other DCT-like transform approaches, since that will typically be shorter than having the origin at the highest frequency position.

This position of the last nonzero coefficient is the first position in the scan order. The coefficients preceding the indicated position are assumed, by the decoder, to be zero. Next, a bitmask comprising flags for the remaining coefficients is transmitted, which shows whether the coefficients are nonzero or not. This is shown in FIG. 6. The last nonzero coefficient is not part of the bitmask, since it is already indicated that this coefficient is nonzero.

Each bit or flag in the transmitted bitmask is sent using a context, here denoted nonZeroContext, that is determined by the position in the original block. For instance, the last bit in the bit mask (corresponding to the top left pixel in the block) uses context 0. Since this is the position of the lowest frequencies, it is quite likely that the coefficient in this position will be nonzero. Therefore, this context 0 has a quite high probability for being nonzero. The bits in the beginning of the bit mask have a relatively much lower probability for being nonzero. As an example, the first transmitted bit in the bit mask will use context 7, which has a relatively low probability of begin nonzero. The encoder and the decoder keep track of probabilities of whether a coefficient at respective position of the block is nonzero to get an efficient compression by the context adaptive binary arithmetic coding engine (CABAC).

After this, the nonzero coefficients are further described, by stating, in another bitmask comprising flags, whether their absolute value is equal to one or if they are larger than one. The reason for this is that a coefficient of magnitude one (+1 or −1) is by far the most common coefficient, so it is efficient to describe them this way. These bits are also transmitted using a context. Since low frequency coefficients typically have the largest values, and since they are in the end of the scan, it is likely that if a value with a magnitude larger than one has been encountered, the next one may also be large. The context model, denoted here greaterThan1Context, tries to reflect this fact, as is shown in FIG. 7.

The context model, greaterThan1Context, is entered with a start position in context 1. If the absolute value of the first coefficient is one, the position is changed to context 2, which has a larger probability that the absolute value of the next coefficient will be of magnitude one. If another absolute value of magnitude one comes, the position is changed to context 3, which has an even larger probability that the absolute value of the next coefficient will be of magnitude one. However, as soon as the absolute value of a subsequent coefficient is larger than magnitude one, the position is changed to context 0, where this probability is much lower. As illustrated in FIG. 7, the procedure then remains in context 0, since there is no state shift leading out of context 0.

Note that this works well when coefficients are transmitted in increasing order. In the beginning, the absolute value of the nonzero coefficients will mostly be of magnitude one, and the method/procedure will be in context 2 or context 3 where the probability of transmitting/receiving a coefficient with an absolute value of magnitude one is high. When the absolute value of a coefficient is higher than one, this indicates a high probability for being near the end of the block, where the large coefficients cluster. Then, it makes sense to move to context 0, which has a much higher probability for coefficients with an absolute value larger than magnitude one.

A flag for indicating if the absolute value of a coefficient among the first eight (up to eight coefficients in this example) is larger than 2 is also transmitted for the coefficients up to the one that is larger than 2.

Lastly, the first coefficients (four in the example: 2, 3, -3 and 6) that have absolute values that are larger than one are predicted to be 2 or 3, and the remaining coefficients are predicted to be 1 and a remaining coefficient value is transmitted to assign correct magnitude values for them, and the signs for the coefficients are also transmitted. Thus, all the information needed to reconstruct the block has now been transmitted/received.

In the decoder, the operations are performed in inverse order; first decoding the coefficients, then inverse-quantization, possibly inverse transform (if not transform skipped block), and then addition of the intra or inter prediction with the residual.

Transform Skip

The coefficient encoding described above works well for the typical case. However, in HEVC it is also possible to skip the transform altogether. The reason for this is that for some types of content, such as computer graphics comprising much contrast, e.g. subtitles, the transform does more harm than good. In such cases it is therefore possible to signal that the transform should be skipped. This is done using a flag called transform_skip_flag. When this flag is set to one, no transform is performed. In this document we will call (denote) a block for which the transform_skip_flag is one a transform skipped block.

However, when the transform is skipped, the coefficient encoding described above does not work so well anymore. As can be seen in FIG. 8, scanning the residual from FIG. 3 without applying the transform will mean that most of the big values will end up in the beginning of the scanned sequence instead of in the end. This means that the coefficient encoding will not work so well.

For example, the last non-zero coefficient, which is indicated by the encoder, will now very often be the first coefficient in the scan (bottom right corner in the block). Thereby, the tail of zeros will not be as easy to describe as for the transformed blocks.

Furthermore, as can be seen in FIG. 9, when sending the bit mask, the contexts will assume the wrong thing. Context 0, which normally has a high probability of being nonzero, will be used for the last value in the scan. But since this last value is the pixel closest to the pixels we predict from (see the right diagram of FIG. 1), this is the pixel that has the largest probability of being zero (having an error or residual of zero).

This is a problem in two ways. First, the coefficient encoding of transform skipped blocks will be inefficient, since the context probabilities will be all wrong. Second, since the contexts are adaptive, the contexts will be destroyed, in regard of transformed blocks, every time a transform skipped block is encoded. The next block, which may be an ordinary block (i.e. transformed), will be coded with inefficient settings of the probabilities in the different contexts.

Below, table 1 comprises residual coding syntax from a HEVC draft text that shows the syntax elements of residual coding in HEVC. Those elements are part of the bitstream that is supposed to be understood by a HEVC decoder.

TABLE 1

| residual_coding( x0, y0, log2TrafoSize, cIdx ) { | Descriptor |
|---|---|
|   if( transform_skip_enabled_flag && !cu_transquant_bypass_flag && ( log2TrafoSize = = 2 ) ) | |
|     transform_skip_flag[ x0 ][ y0 ][ cIdx ] | ae(v) |
|   last_significant_coeff_x_prefix | ae(v) |
|   last_significant_coeff_y_prefix | ae(v) |
|   if( last_significant_coeff_x_prefix > 3 ) | |
|     Last_significant_coeff_x_suffix | ae(v) |
|   if( last_significant_coeff_y_prefix > 3 ) | |
|     Last_significant_coeff_y_suffix | ae(v) |
|   lastScanPos = 16 | |
|   lastSubBlock = ( 1 << ( log2TrafoSize − 2 ) * ( 1 << ( log2TrafoSize − 2 ) ) − 1 | |
|   Do { | |
|     if( lastScanPos = = 0 ) { | |
|       lastScanPos = 16 | |
|       lastSubBlock− − | |
|     } | |
|     lastScanPos− − | |
|     xS = ScanOrder[ log2TrafoSize − 2 ][ scanIdx ][ lastSubBlock ][ 0 ] | |
|     yS = ScanOrder[ log2TrafoSize − 2 ][ scanIdx ][ lastSubBlock ][ 1 ] | |
|     xC = ( xS <<2 ) + ScanOrder[ 2 ][ scanIdx ][ lastScanPos ][ 0 ] | |
|     yC = ( yS <<2 ) + ScanOrder[ 2 ][ scanIdx ][ lastScanPos ][ 1 ] | |
|   } while( ( xC != LastSignificantCoeffX ) || ( yC != LastSignificantCoeffY ) ) | |
|   For( i = lastSubBlock; i >= 0; i− − ) { | |
|     xS = ScanOrder[ log2TrafoSize − 2 ][ scanIdx ][ i ][ 0 ] | |
|     yS = ScanOrder[ log2TrafoSize − 2 ][ scanIdx ][ i ][ 1 ] | |
|     inferSigCoeffFlag = 0 | |

TABLE 1-continued

| residual_coding( x0, y0, log2TrafoSize, cIdx ) { | Descriptor |
|---|---|
|     if( ( i < lastSubBlock ) && ( i > 0 ) ) { | |
|       coded_sub_block_flag[ xS ][ yS ] | ae(v) |
|       inferSigCoeffFlag = 1 | |
|     } | |
|     for( n = (i == lastSubBlock) ? lastScanPos − 1 : 15; n >= 0; n− − ) { | |
|       xC = ( xS << 2 ) + ScanOrder[ 2 ][ scanIdx ][ n ][ 0 ] | |
|       yC = ( yS << 2 ) + ScanOrder[ 2 ][ scanIdx ][ n ][ 1 ] | |
|       If( coded_sub_block_flag[ xS ][ yS ] && ( n > 0 \|\| !inferSigCoeffFlag ) ) { | |
|         significant_coeff_flag[ xC ][ yC ] | ae(v) |
|         if( significant_coeff_flag[ xC ][ yC ] ) | |
|           inferSigCoeffFlag = 0 | |
|       } | |
|     } | |
|     firstSigScanPos = 16 | |
|     lastSigScanPos = −1 | |
|     numGreater1Flag = 0 | |
|     firstGreater1ScanPos = −1 | |
|     for( n = 15; n >= 0; n− − ) { | |
|       xC = ( xS << 2 ) + ScanOrder[ 2 ][ scanIdx ][ n ][ 0 ] | |
|       yC = ( yS << 2 ) + ScanOrder[ 2 ][ scanIdx ][ n ][ 1 ] | |
|       If( significant_coeff_flag[ xC ][ yC ] ) { | |
|         if( numGreater1Flag < 8 ) { | |
|           coeff_abs_level_greater1_flag[ n ] | ae(v) |
|           numGreater1Flag++ | |
|           if( coeff_abs_level_greater1_flag[ n ] && firstGreater1ScanPos == −1) | |
|             firstGreater1ScanPos = n | |
|         } | |
|         if( lastSigScanPos == −1) | |
|           lastSigScanPos = n | |
|         firstSigScanPos = n | |
|       } | |
|     } | |
|     signHidden = ( lastSigScanPos − firstSigScanPos > 3 && !cu_ transquant_bypass _flag ) | |
|     if( firstGreater1ScanPos != −1 ) | |
|       Coeff_abs_level_greater2_flag[ firstGreater1ScanPos ] | ae(v) |
|     for( n = 15; n >= 0; n− − ) { | |
|       xC = ( xS << 2 ) + ScanOrder[ 2 ][ scanIdx ][ n ][ 0 ] | |
|       yC = ( yS << 2 ) + ScanOrder[ 2 ][ scanIdx ][ n ][ 1 ] | |
|       If( significant_coeff_flag[ xC ][ yC ] && | |
|         ( !sign_data_hiding_flag \|\| !signHidden \|\| n != firstSigScanPos ) ) | |
|         coeff_sign_flag[ n ] | ae(v) |
|     } | |
|     numSigCoeff = 0 | |
|     sumAbsLevel = 0 | |
|     for( n = 15; n >= 0; n− − ) { | |
|       xC = ( xS << 2 ) + ScanOrder[ 2 ][ scanIdx ][ n ][ 0 ] | |
|       yC = ( yS << 2 ) + ScanOrder[ 2 ][ scanIdx ][ n ][ 1 ] | |
|       if( significant_coeff_flag[ xC ][ yC ] ) { | |
|         baseLevel = 1 + coeff_abs_level_greater1_flag[ n ] + coeff_abs_level_greater2_flag[ n ] | |
|         if( baseLevel == ( ( numSigCoeff < 8 ) ? ( (n == firstGreater1ScanPos) ? 3 : 2 ) : 1 ) ) | |
|           coeff_abs_level_remaining[ n ] | ae(v) |
|         TransCoeffLevel[ x0 ][ y0 ][ cIdx ][ xC ][ yC ] = | |
|           ( coeff_abs_level_remaining[ n ] + baseLevel) * ( 1 − 2 * coeff_sign_flag[ n ] ) | |
|         if( sign_data_hiding_flag && signHidden ) { | |
|           sumAbsLevel += ( coeff_abs_level_remaining[ n ] + baseLevel ) | |
|           if( n == firstSigScanPos && ( ( sumAbsLevel % 2 ) == 1) ) | |
|             TransCoeffLevel[x0][y0][cIdx ][xC][yC] = | |
| − TransCoeffLevel[x0][y0][cIdx][xC][yC] | |
|         } | |
|         numSigCoeff++ | |
|       } | |
|     } | |
|   } | |
| } | |

A solution to the problem described above has been proposed in JCTVC (Joint Collaborative Team on Video Coding). The proposed solution was to reverse the scan order when the block is a transform skipped block.

However, applying this suggested solution would mean that new, reversed scan orders must be implemented. Since implementation of new scan orders can be expensive in hardware, the JCTVC group decided not to recommend adoption of that proposal.

SUMMARY

In HEVC, data is encoded by predicting the pixel values in a certain area, e.g. a 4×4 block, and then encode the difference between the predicted pixel values and the original pixel values. This difference is typically referred to as the residual, and the coding is referred to as residual coding. In most cases, the residual is further encoded by first transforming it with a DCT-like transform, quantizing the transform coefficients, and then encoding the resulting transform coefficients in a certain order. The decoder then decodes the quantized transform coefficients, inverse quantize them and performs inverse transform and adds that to the prediction to generate a reconstruction of the block, which is aimed to be similar to the original block.

However, recently it has been shown that for some blocks, better results are obtained by not invoking the transform, and instead encoding the residuals, i.e. the prediction error values, as if they were transform coefficients (even though they are not). This option is called transform skip. The decoder then decodes the quantized prediction errors inverse quantize them and adds that to the prediction to generate a reconstruction of the block.

Herein is disclosed a solution which improves encoding/decoding of transform skipped blocks. The solution is applicable both for conventional scan order and for reverse scan order, and improves the results of the encoding and decoding for either type of scan order. This is achieved by improving the contexts for the signalling of nonzero residual values and coefficients.

According to a first aspect, a method is provided, which is to be performed by a video decoder. The decoder is operable according to a video decoding scheme applying residual decoding comprising use of a context model for deriving contexts to be used for decoding flags, in a bitmask, which flags indicate, respectively, whether an absolute value of a non-zero transform coefficients in a transformed residual block is greater than one. The context model comprises a plurality of states, where each state corresponds to a context and a probability. A procedure for deriving contexts for a number of flags related to transform coefficients (i.e. not residual values) is started in a first state, A, and where, after decoding a flag which corresponds to an absolute value of a transform coefficient that is greater than one, the context model goes to a second state, D, which is used for decoding remaining flags in said bitmask. The method comprises; for a transform-skipped residual block comprising residual values, and not transform coefficients, deriving of contexts to be used for decoding flags, in a bitmask, where the flags indicate, respectively, whether an absolute value of a non-zero residual value in the transform-skipped block is greater than one, by use of the context model. However, this time starting in the second state D instead of in the first state A, as for transformed blocks.

According to a second aspect, a method is provided, which is to be performed by a video encoder. The video encoder is operable according to a video encoding scheme applying residual encoding comprising use of a context model for associating contexts to flags in a bitmask, which flags indicate, respectively, whether an absolute value of a non-zero transform coefficients in a transformed residual block is greater than one, where the context model comprises a plurality of states, each state corresponding to a context and a probability. A procedure for deriving contexts to be associated with a number of flags related to transform coefficients is started in a first state, A, and, after encoding a flag which corresponds to a transform coefficient greater than one, the context model goes to a second state, D, which is used for encoding remaining flags in said bitmask. The method comprises; for a transform-skipped residual block comprising residual values, and not transform coefficients, deriving of contexts to be associated with flags, i.e. used for encoding flags, in a bitmask, where the flags indicate, respectively, whether an absolute value of a non-zero residual value in the transform-skipped block is greater than one, by use of the context model. However, this time starting in the second state D instead of in the first state A, as for transformed blocks.

According to a third aspect, a video decoder is provided. The video decoder is operable to decode video according to a video decoding scheme which applies residual decoding. The decoding scheme comprises use of a context model for deriving contexts to be used for decoding flags in a bitmask, which flags indicate, respectively, whether an absolute value of a non-zero transform coefficients in a transformed residual block is greater than one. The context model comprises a plurality of states, each state corresponding to a context and a probability. The procedure for deriving 1003 contexts for a number of flags related to transform coefficients is started in a first state, A, and, after decoding a flag which corresponds to an absolute value of a transform coefficient that is greater than one, the context model goes to a second state, D, which is used for decoding remaining flags in said bitmask.

According to a fourth aspect, a video encoder is provided. The video encoder is operable to encode video according to a video encoding scheme which applies residual encoding. The encoding scheme comprises use of a context model for deriving contexts to be used for encoding, to be associated with, flags in a bitmask, which flags indicate, respectively, whether an absolute value of a non-zero transform coefficients in a transformed residual block is greater than one. The context model comprises a plurality of states, each state corresponding to a context and a probability. The procedure for deriving contexts for a number of flags related to transform coefficients is started in a first state, A, and, after encoding a flag which corresponds to an absolute value of a transform coefficient that is greater than one, the context model goes to a second state, D, which is used for encoding remaining flags in said bitmask.

The embodiments apply to a decoder, an encoder and any element that operates on a bitstream, such as a network-node or a Media Aware Network Element. The encoder may for example be located in a transmitter in a video camera in e.g. a mobile device. The decoder may for example be located in a receiver in a video camera or any other device for displaying a video stream.

The embodiment is not limited to HEVC but may be applied to any extension of HEVC such as a range extension or scalable extension or multiview extension or to a different video codec.

An advantage with the embodiments is that at least one of them provides compression efficiency increase, i.e. the bit rate is lowered for the same quality level. Further, the solution presented herein enables that encoding/decoding of transform blocks helps updating the context used for coding/decoding of transform skipped (non-transformed) blocks and the other way around, resulting more efficient encoding/decoding.

BRIEF DESCRIPTION OF THE DRAWINGS

The foregoing and other objects, features, and advantages of the technology disclosed herein will be apparent from the following more particular description of embodiments as illustrated in the accompanying drawings. The drawings are not necessarily to scale, emphasis instead being placed upon illustrating the principles of the technology disclosed herein.

DETAILED DESCRIPTION

As previously described, the encoding and decoding of transform skipped blocks, e.g., in HEVC, is associated with some problems. The description below will concentrate on the part of the encoding and decoding where a block to be encoded has been scanned, a bitmask indicating which residual values/coefficients that are nonzero has been derived, and a bitmask indicating which of the nonzero residual values/coefficients that are greater than one is to be derived.

Figure 7:
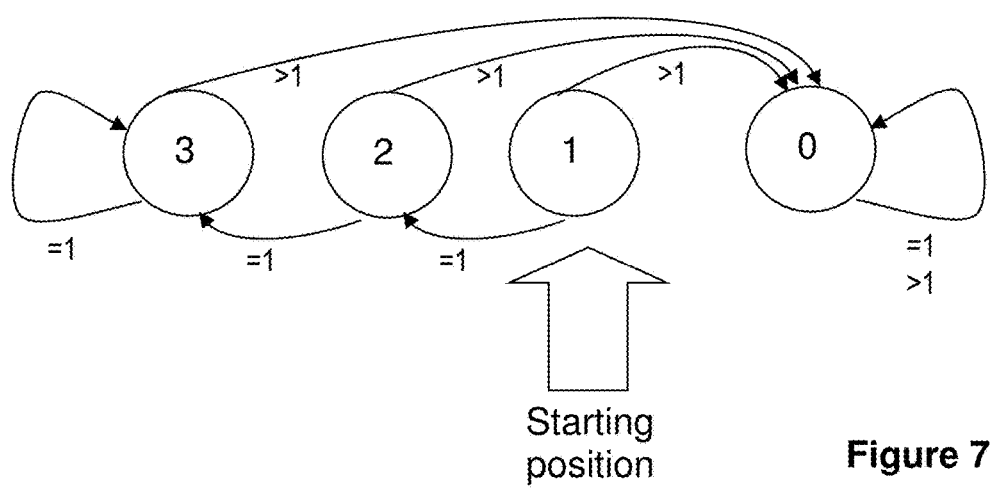
FIG. 7 illustrates a context model and the start position used for encoding/decoding of transform blocks.
Figure 8:
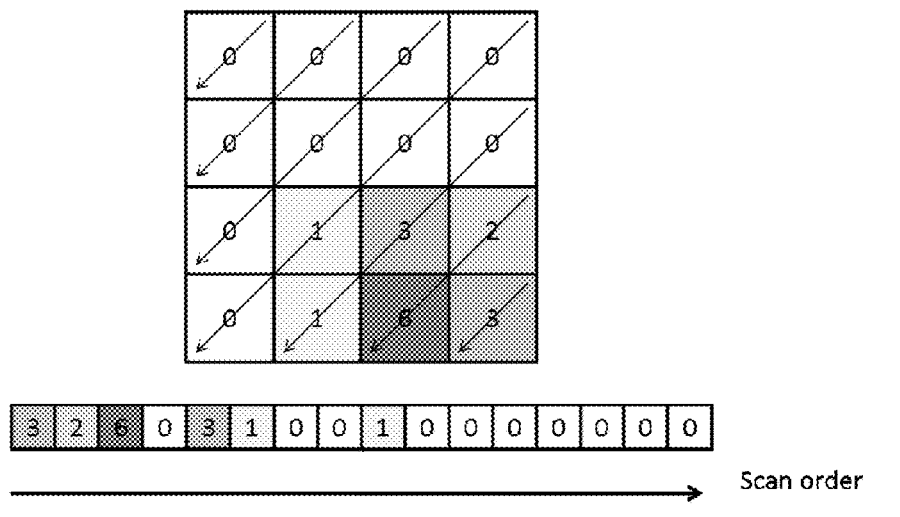
FIG. 8 illustrates transform skip and diagonal scan order.

When specifying, in a bitmask, whether the absolute values of coefficients are equal to one or higher, a context model is used for associating a context to each flag, or position in the bitmask, see FIG. 7. In case of transform skipped residual blocks, this context model does not work so well. The reason for this is that transform skipped residual blocks have high values in the beginning of the scanned sequence of values, whereas a transform residual block has higher values at the very end of the scanned sequence of transform coefficients (given conventional scan order for both types). Thus, when using the state machine for a transform skipped residual block, a context implying that there is a low probability for that the absolute value of a residual value is higher than one will be associated with the first residual value in the scanned sequence. However, this low probability is false, since in fact, there is a very high probability that the absolute value of the first residual value is higher than 1 for the transformed skipped block. The assignment of a low probability context to a flag which should be associated with a high probability context leads to that the encoder/decoder will need to spend more bits on encoding/decoding the flag, since the assigned probability does not match reality. Further, since the probabilities values in the state machine/model is continuously adjusted based on encoded/decoded data, the probability value in the state associated with the bad match will degenerate/deteriorate due to the bad match. Thus, the encoding and decoding of a subsequent block will be compromised.

One solution to this problem could be to introduce a new context model, which was to be used for transform skipped blocks, and which was designed to match the properties of non-transformed blocks. However, this would add complexity for encoders and decoders in order to support an additional context model. Therefore, this solution is not very attractive.

To solve the problem, the applicant has realized that the context model for transformed residual blocks could be reused for transform skipped blocks, even though the transform coefficients and the non-transformed residual values are very different in character. The reuse is achieved by changing the starting position in the state machine, i.e. the state in which the procedure is started, which will be further described below.

In the following paragraphs, different aspects of the solution disclosed herein will be described in more detail with references to certain embodiments and to accompanying drawings. For purposes of explanation and not limitation, specific details are set forth, such as particular scenarios and techniques, in order to provide a thorough understanding of the different embodiments. However, other embodiments may depart from these specific details.

Exemplifying embodiments of a method performed by a video decoder will now be described with reference to FIG. 10a. The video decoder is operable according to a video decoding scheme, such as HEVC, which applies residual decoding. The residual decoding comprising use of a context model for deriving contexts to be used for decoding flags in a bitmask. The flags indicate, respectively, whether an absolute value of a non-zero transform coefficients in a transformed residual block is greater than one. The context model comprises a plurality of states, each state corresponding to a context and a probability, and a procedure for deriving contexts for a number of flags related to transform coefficients associated with a certain block or bitmask is started in a first state, A (cf. state "1" in FIG. 7), and where, after decoding a flag which corresponds to an absolute value of a transform coefficient that is greater than 1 (>1), the context model goes to a second state, D (cf. state 0 in FIG. 7), which is used for decoding remaining flags. Between the first state A and the second state B, the procedure may traverse a number of other states when having decoded one or more flags which correspond to an absolute value of a transform coefficient that is equal to one (=1), as illustrated in FIG. 7.

Figure 10A:
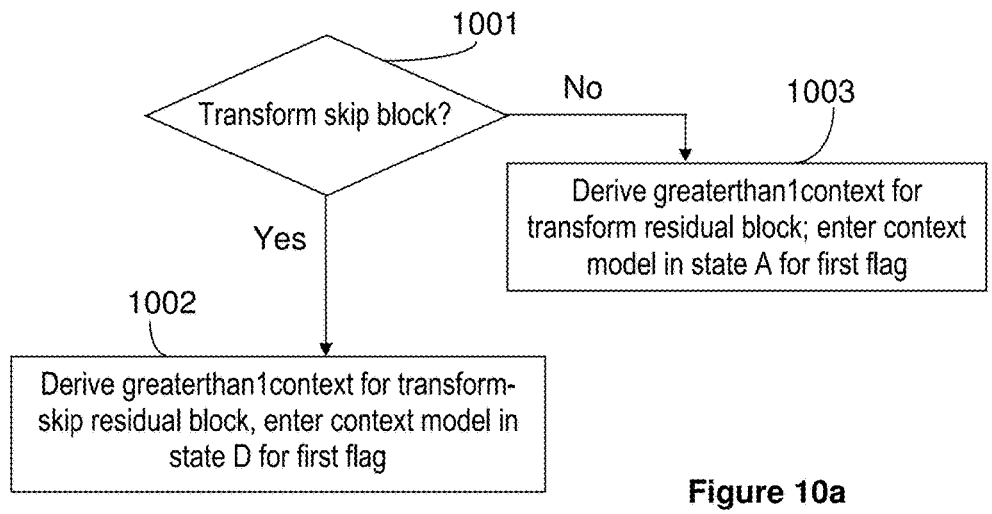
FIGS. 10a and 10b illustrate procedures according to exemplifying embodiments. The procedures are applicable both for an encoder and a decoder side.

FIG. 10a illustrates the method comprising deriving 1002 contexts to be used for decoding flags, in a bitmask, that indicate, respectively, whether an absolute value of a non-zero residual value in the transform skipped block is greater than one, by use of the context model, starting in the second state D.

By this measure, improved encoding and decoding of transform skipped residual blocks is enabled, without need to introduce new context models, especially adapted for transform skipped blocks. The solution does only introduce a minor additional complexity in that the decoder needs to change start position in a context model depending on which type of block that is to be decoded. The solution is relatively easy to implement and both transform and non-transformed blocks contribute to the same context model which makes it adapt faster to the decoded content.

Figure 11:
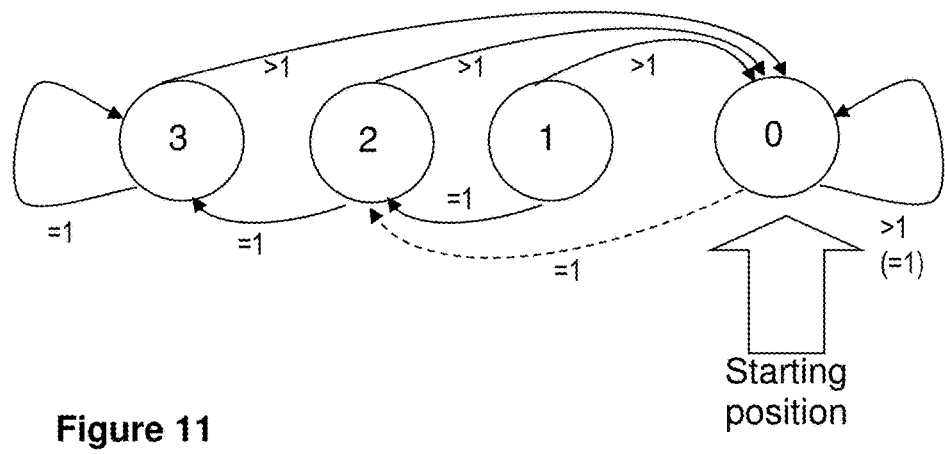
FIG. 11 illustrates the context model illustrated in FIG. 7 and the start position used for encoding/decoding of transform skip blocks according to an exemplifying embodiment.

FIG. 11 illustrates the change of start position in the context model, as compared to the start position in FIG. 7. The starting position is moved from context 1 to context 0 in the terminology of FIG. 11. Above, context 1 was denoted context A, and context 0 as denoted context D. In FIG. 11 is also illustrated, using a dashed line, an optional possibility of leaving state or context 0 (D) when a decoded absolute value is equal to 1. For example, if the coefficient has an absolute value of 1, this could imply a transit to context 2 in the context model. Alternatively, the transit could be performed to context 1 or even context 3. Another possibility is to make a transit to another context when a predefined number of coefficients have been determined to have an absolute value of 1. However, this option of leaving context or state 0 is not necessary or mandatory. Context 0 (D) is associated with a high probability for that the absolute value of a residual value (or transform coefficient) is larger than 1 (>1). In an exemplifying embodiment, the procedure for deriving contexts for a transform skipped block remains in context 0, state D, for decoding all flags in a bitmask associated with a transform skipped block.

Further, the solution described above is applicable for transform skipped blocks also when applying reverse scan order for such blocks. Thus, the solution may be combined with a reversal of the scan order for transform skipped blocks. The applying of reverse scan order is illustrated as action 1004 in FIG. 10*b*. When the scan order is reversed, the small residual values will typically arrive first in scan order in the case of intra prediction. For inter prediction the residual values do not have this property, small values can come anywhere along the scan order. However, since no energy-compacting transform has been applied for transform skipped blocks, even the smallest values in the beginning of the scan order may be relatively large. The applicant has realized that it is beneficial to start in context 0 even in the case when the scan order has been reversed for transform skipped blocks.

Embodiments herein also relate to a method performed by a video encoder. The method performed by the video encoder is performed in order to enable improved performance in the encoder and also in a corresponding video decoder when encoding and decoding transform-skipped blocks. The video encoder is operable according to a video encoding scheme applying residual encoding. The residual encoding comprises use of a context model for associating contexts to flags in a bitmask, which flags indicate, respectively, whether an absolute value of a non-zero transform coefficient in a transformed residual block is greater than one. The context model comprises a plurality of states, where each state corresponds to a context and a probability. When deriving (1202) contexts to be associated with a number of flags in a bitmask related to transform coefficients, the procedure for doing this is started in a first state, A, and where, after encoding a flag in the bitmask which corresponds to a transform coefficient greater than 1, the context model goes to a second state, D, which is used for encoding remaining flags. As for the decoder, the model may comprise other states, which may be traversed, between the first state A and the second state B, when having decoded one or more flags which correspond to an absolute value of a transform coefficient that is equal to one (=1)

Such a method performed by a video encoder, will now be described with reference to FIG. 10*a*. FIG. 10*a* illustrates the method comprising, for a transform skipped residual block comprising residual values, i.e. not transform coefficients, deriving 1002 contexts to be associated with flags in a bitmap, which flags indicate, respectively, whether an absolute value of a non-zero residual value in the transform skipped residual block is greater than one, by use of the context model, starting in the second state D.

The features and benefits of the method performed by a video encoder are the same as for the method performed by the video decoder described above, although some properties may be different or described differently due to the difference between encoder and decoder.

The methods above could be implemented in pseudo code as follows:

```
if(isTransformSkip){
        // transform skip is used
        Start_position = state0;}
else{
        // transform skip is not used
        Start_position = state1
}
```

The entire process of encoding and decoding a block comprises many actions, which are not described in detail herein, but which may be assumed to be familiar to a person skilled in the art. The general concept of context models in video encoding and decoding is well known in the art.

Video Decoder

Embodiments described herein also relate to a video decoder. The video decoder is associated with the same technical features, objects and advantages as the method described above and illustrated e.g. in FIGS. 10*a* and 10*b*. The video decoder will be described in brief in order to avoid unnecessary repetition. The video decoder could be comprised in a device or UE, such as a smart phone, a video camera, a tablet or any other type of equipment in which a video signal is to be decoded.

Figure 12A:
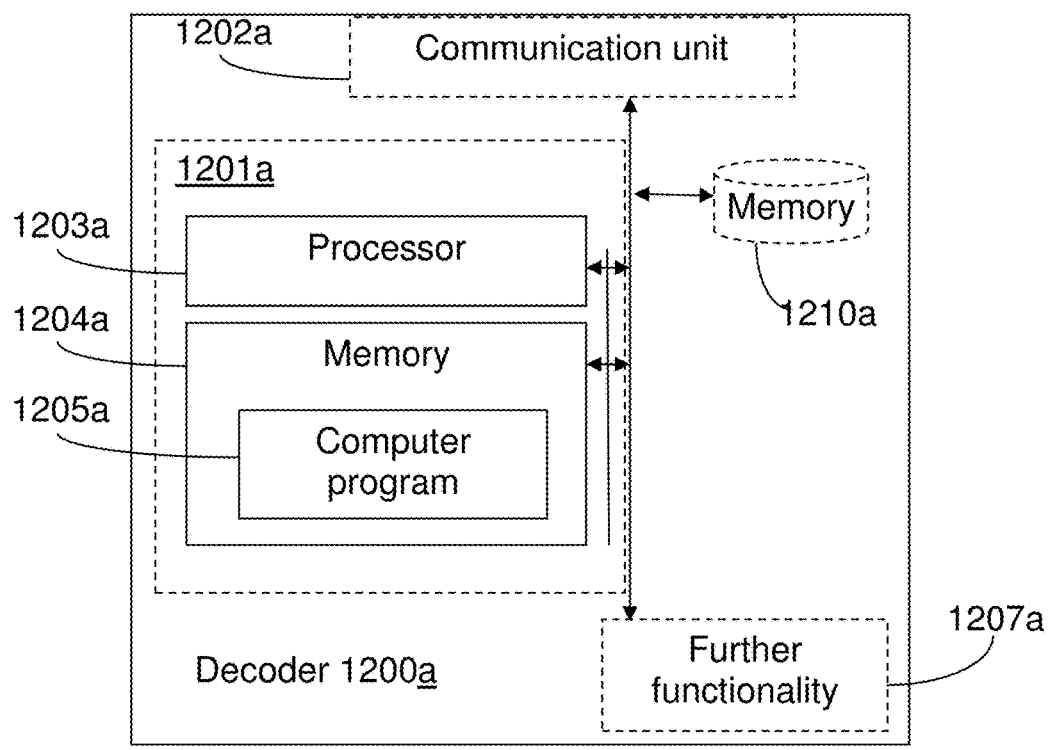
FIGS. 12a and 12b illustrate exemplifying embodiments of a video decoder.

Below, an exemplifying video decoder 1200*a*, adapted to enable the performance of an above described method adapted to perform at least one embodiment of the method in a video decoder described above, will be described with reference to FIG. 12*a*. The video decoder 1200*a* is operable to decode video according to a video decoding scheme which applies residual decoding. The decoding scheme comprises use of a context model for deriving contexts to be used for decoding flags in a bitmask, which flags indicate, respectively, whether an absolute value of a non-zero transform coefficients in a transformed residual block is greater than one. The context model comprises a plurality of states, each state corresponding to a context and a probability. The procedure for deriving 1003 contexts for a number of flags related to transform coefficients is started in a first state, A, and, after decoding a flag which corresponds to an absolute value of a transform coefficient that is greater than 1, the context model goes to a second state, D, which is used for decoding remaining flags in said bitmask.

The part of the video decoder which is most affected by the adaptation to the herein described method is illustrated as an arrangement 1201*a*, surrounded by a dashed line. The video decoder 1200*a* and arrangement 1201*a* are further illustrated as to communicate with other entities via a communication unit 1202*a* comprising means for wireless and/or wired communication. The video decoder or arrangement may further comprise other functional units 1207*a* and may further comprise one or more storage units 1210*a*.

The arrangement part of the video decoder may be implemented and/or described as follows:

The video decoder 1200*a* comprises processing means 1203*a* and a memory 1204*a*. The memory comprises instructions 1205*a*, which when executed by the processing means causes the video decoder 1200*a* to, for a transform skipped residual block comprising residual values [and not transform coefficients], derive 1002 contexts to be used for decoding flags, in a bitmask, which flags indicate, respectively, whether an absolute value of a non-zero residual value in the transform skipped block is greater than one, by use of the context model, starting in the second state D. By this, an improved encoding and decoding of transform skipped residual blocks is enabled.

Figure 12B:
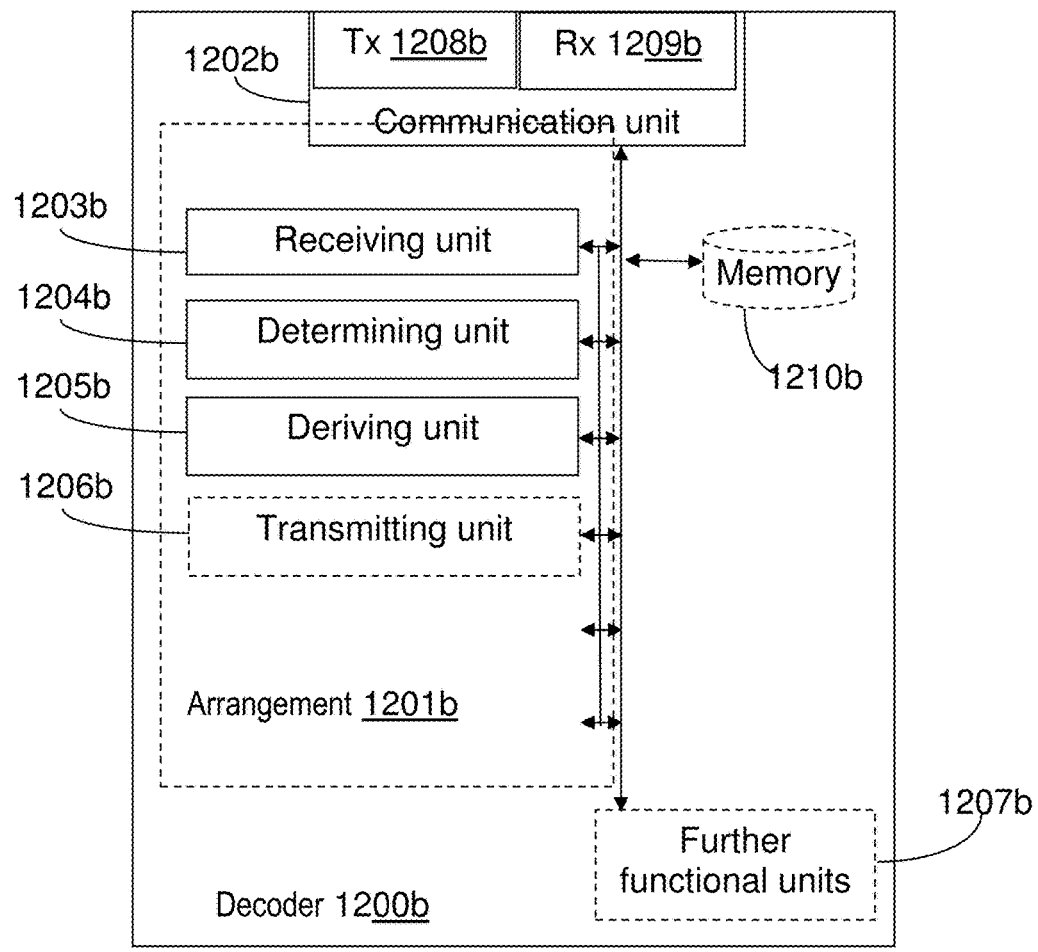

An alternative embodiment of the video decoder 1200*a* is shown in FIG. 12*b*. FIG. 12*b* illustrates video decoder 1200*b*, operable to decode video according to a video decoding scheme which applies residual decoding as described above for video decoder 1200*a*.

The arrangement 1201*b* may comprise a receiver 1203*b*, configured to receive a signal to be decoded. The arrangement may further comprise a determining unit 1204*b*, configured to determine whether the signal relates to a transform skipped residual block or not. The arrangement further comprises a deriving unit 1205*b*, adapted to derive, for a transform skipped residual block comprising residual values (and not transform coefficients), contexts to be used for decoding flags, in a bitmask, which flags indicate, respectively, whether an absolute value of a non-zero residual value in the transform skipped block is greater than one, by use of the context model, starting in the second state D. The arrangement may further comprise a transmitting unit 1206*b*, adapted to transmit or provide the derived contexts to some other unit or entity.

Figure 10B:
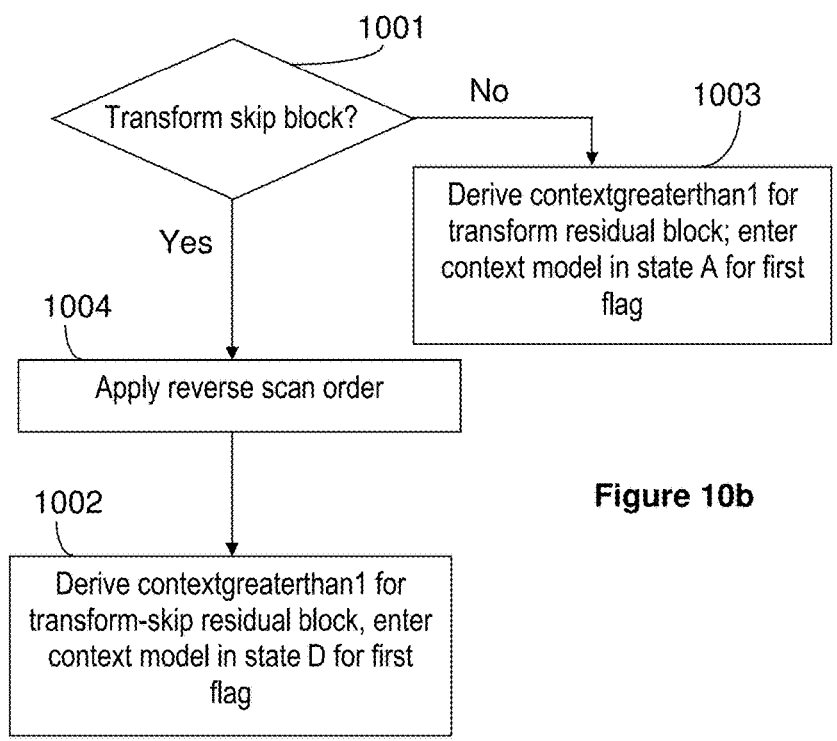

The arrangement 1201*b* could be implemented e.g. by one or more of: a processor or a micro processor and adequate software and memory for storing thereof, a Programmable Logic Device (PLD) or other electronic component(s) or processing circuitry configured to perform the actions described above, and illustrated e.g. in FIGS. 10*a* and 10*b*.

Video Encoder

Embodiments described herein also relate to a video encoder. The video encoder is associated with the same technical features, objects and advantages as the method described above and illustrated e.g. in FIGS. 10*a* and 10*b*. The video encoder will be described in brief in order to avoid unnecessary repetition. The video encoder could be comprised in a device or UE, such as a smart phone, a video camera, a tablet or any other type of equipment in which a video signal is to be encoded.

Figure 13A:
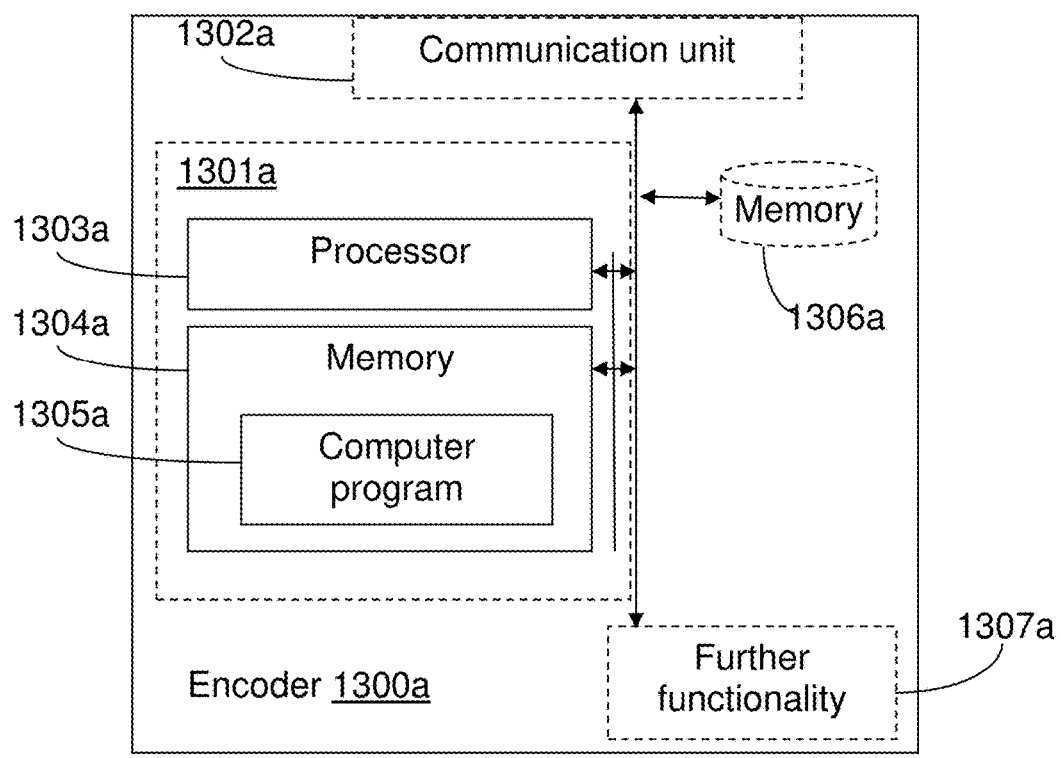
FIGS. 13a and 13b illustrate exemplifying embodiments of a video encoder.

Below, an exemplifying video encoder 1300*a*, adapted to enable the performance of an above described method adapted to perform at least one embodiment of the method in a video decoder described above, will be described with reference to FIG. 13*a*. The video encoder 1300*a* is operable to encode video according to a video encoding scheme which applies residual encoding. The encoding scheme comprises use of a context model for deriving contexts to be used for encoding, to be associated with, flags in a bitmask, which flags indicate, respectively, whether an absolute value of a non-zero transform coefficients in a transformed residual block is greater than one. The context model comprises a plurality of states, each state corresponding to a context and a probability. The procedure for deriving 1003 contexts for a number of flags related to transform coefficients is started in a first state, A, and, after encoding a flag which corresponds to an absolute value of a transform coefficient that is greater than 1, the context model goes to a second state, D, which is used for encoding remaining flags in said bitmask.

The part of the video encoder which is most affected by the adaptation to the herein described method is illustrated as an arrangement 1301*a*, surrounded by a dashed line. The video encoder 1300*a* and arrangement 1301*a* are further illustrated as to communicate with other entities via a communication unit 1302*a* comprising means for wireless and/or wired communication. The video decoder or arrangement may further comprise other functional units 1307*a* and may further comprise one or more storage units 1310*a*.

The arrangement part of the video encoder may be implemented and/or described as follows:

The video encoder 1300*a* comprises processing means 1303*a* and a memory 1304*a*. The memory comprises instructions 1305*a*, which when executed by the processing means causes the video decoder 1300*a* to, for a transform skipped residual block comprising residual values [and not transform coefficients], derive 1002 contexts to be used for encoding flags, in a bitmask, which flags indicate, respectively, whether an absolute value of a non-zero residual value in the transform skipped block is greater than one, by use of the context model, starting in the second state D. By this, an improved encoding and decoding of transform skipped residual blocks is enabled.

Figure 13B:
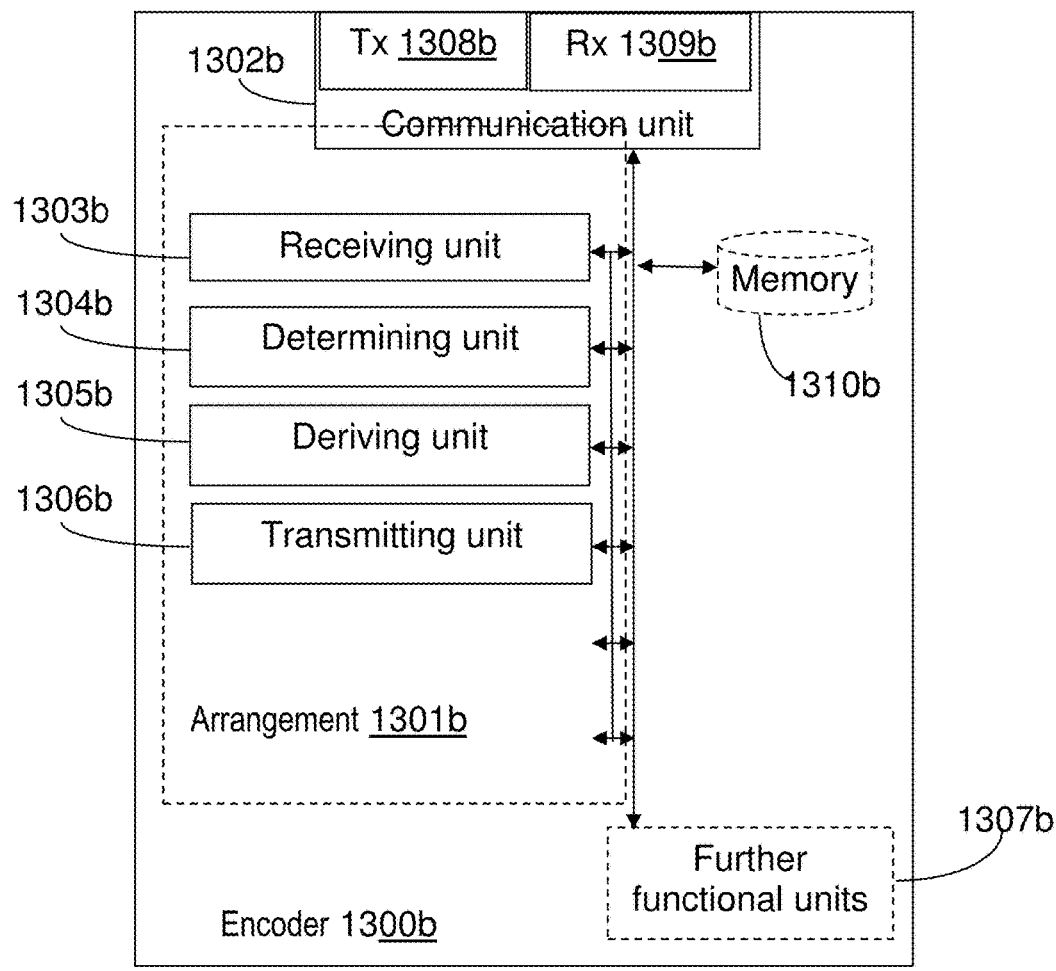
Figure 14A:
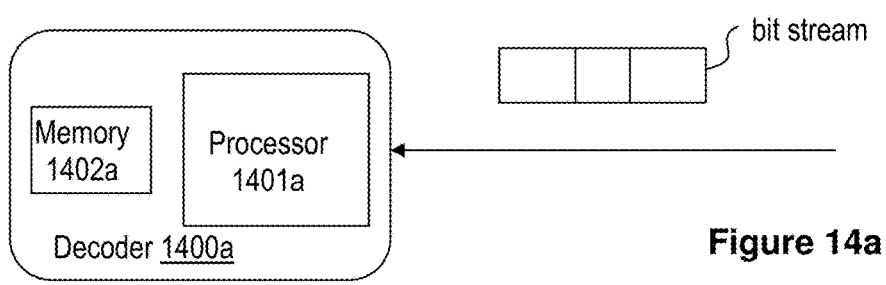
FIGS. 14a and 14b illustrate an exemplifying decoder and a encoder according to an embodiment, each comprising a processor and a memory.
Figure 14B:
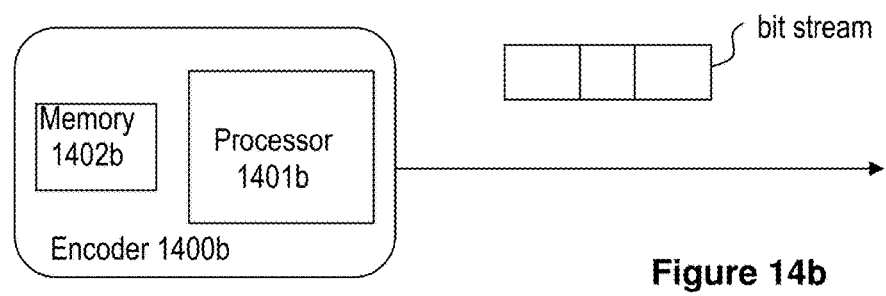

An alternative embodiment of the video encoder 1300*a* is shown in FIG. 13*b*. FIG. 13*b* illustrates video decoder 1300*b*, operable to decode video according to a video encoding scheme which applies residual encoding as described above for video encoder 1300*a*.

The arrangement 1301*b* may comprise a receiver 1303*b*, configured to receive a signal to be encoded. The arrangement may further comprise a determining unit 1304*b*, configured to determine whether the signal relates to a transform skipped residual block or not. The arrangement further comprises a deriving unit 1305*b*, adapted to derive, for a transform skipped residual block comprising residual values (and not transform coefficients), contexts to be used for encoding flags, in a bitmask, which flags indicate, respectively, whether an absolute value of a non-zero residual value in the transform skipped block is greater than one, by use of the context model, starting in the second state D. The arrangement may further comprise a transmitting unit 1306*b*, adapted to transmit or provide the derived contexts to some other unit or entity.

The arrangement 1301*b* could be implemented e.g. by one or more of: a processor or a micro processor and adequate software and memory for storing thereof, a Programmable Logic Device (PLD) or other electronic component(s) or processing circuitry configured to perform the actions described above, and illustrated e.g. in FIGS. 10*a* and 10*b*.

The processor described above may be a single CPU (Central processing unit), but could also comprise two or more processing units. For example, the processor may include general purpose microprocessors; instruction set processors and/or related chips sets and/or special purpose microprocessors such as ASICs (Application Specific Integrated Circuit). The processor may also comprise board memory for caching purposes. The computer program may be carried by a computer program product connected to the processor. For example, the computer program product may be a flash memory, a RAM (Random-access memory) ROM (Read-Only Memory) or an EEPROM, and the computer program could in alternative embodiments be distributed on different computer program products in the form of memories within the video decoder and video decoder respectively.

It is to be understood that the choice of interacting units, as well as the naming of the units within this disclosure are only for exemplifying purpose, and nodes suitable to execute any of the methods described above may be configured in a plurality of alternative ways in order to be able to execute the suggested procedure actions.

It should also be noted that the units described in this disclosure are to be regarded as logical entities and not with necessity as separate physical entities.

While the embodiments have been described in terms of several embodiments, it is contemplated that alternatives, modifications, permutations and equivalents thereof will become apparent upon reading of the specifications and study of the drawings. It is therefore intended that the following appended claims include such alternatives, modifications, permutations and equivalents as fall within the scope of the embodiments.

Further Improvements of Encoding/Decoding of Transform Skipped Blocks

Below, further solutions related to encoding/decoding of transform skipped blocks will be described. These solutions below are to be used with traditional scanning order, i.e. not with reversed scan order. The solution previously described in this document is suitable for use with both traditional scan order and reverse scan order. Further below, as an appendix, will follow a suggested contribution to a HEVC standard forum.

Context Flip for Indication of Non-Zero Coefficients

Figure 9:
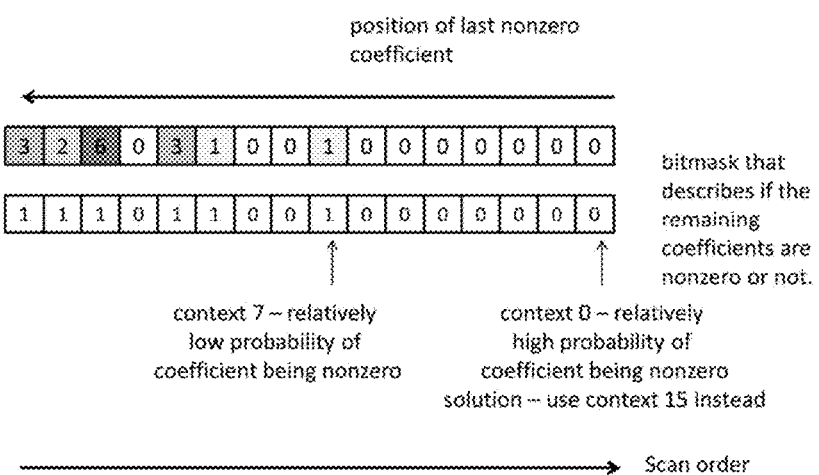
FIG. 9 illustrates how, in a transform skipped block, the probabilities of the contexts will be all wrong when applying a context model according to the prior art.

This solution solves the problem of the nonZeroContext contexts for the bit masks when encoding/decoding transform skipped blocks. As shown in FIG. 9, the context 0 is unsuitable for the last residual value in a transform skipped block, since it gives too high a probability for a nonzero coefficient (or rather residual value in case of transform skipped blocks. The term coefficient is kept here to illustrate that these contexts are derived for transform coefficients in transform blocks). The inventors suggest a solution to this problem, where the solution comprises to instead use context 15 for the last residual value. Context 15 has a low probability for a nonzero coefficient. Hence the contexts are reversed relative to the normal way of encoding when encoding transform blocks. The suggested context flip is illustrated by the following lines of code:

```
if(isTransformSkip)
    //transform skip is used
    uiCtxSig=TComTrQuant::getSigCtxInc(patternSigCtx,
        uiScanIdx, 3-uiPosX, 3-uiPosY, blockType, uiWidth,
        uiHeight, eTType);
else
    //transform skip is not used
    uiCtxSig=TComTrQuant::getSigCtxInc(patternSigCtx,
        uiScanIdx, uiPosX, uiPosY, blockType, uiWidth,
        uiHeight, eTType);
```

The if-statement checks if the block is a transform skipped block. uiPosX and uiPosY is the position of a coefficient or residual value where uiPosX=0 and uiPosY=0 corresponds to the top left corner of the block. If the block is transform skipped, the coordinates of the pixel are inverted; uiPosX becomes 3-uiPosX, and dito for uiPosY. In our example where uiPosX=0 and uiPosY=0, this means that, for a transform skipped block, the function will be called with the parameters 3, 3, which selects context 15. For a transform block, the function will be called with the parameters 0, 0, which selects context 0.

This gives a double effect; the transform skipped blocks become better encoded, and the regular transform blocks do not get their contexts destroyed, so their encoding/decoding is also improved.

Another possible change is to unify the scan direction of horizontal and vertical scan, for both transform skip and transform coded blocks, and only use one of the scans, for example horizontal scan. Instead the appropriate context for horizontally predicted blocks, where state of the art use vertical scan, can use the uiPosX for uiPosY and uiPosY for uiPosX as indicated in code below:

```
if(isTransformSkip){
    // transform skip is used
    if(verticalIntraPrediction || horisontalIntraPrediction)
        uiCtxSig = TComTrQuant::getSigCtxInc( patternSigCtx,
            uiScanIdx, 3-
uiPosY , 3-uiPosX, blockType, uiWidth, uiHeight, eTType );
    else
        uiCtxSig = TComTrQuant::getSigCtxInc( patternSigCtx,
            uiScanIdx, 3-
uiPosX, 3-uiPosY, blockType, uiWidth, uiHeight, eTType );
}else{
    // transform skip is not used
    if(verticalIntraPrediction || horisontalIntraPrediction)
        uiCtxSig = TComTrQuant::getSigCtxInc(patternSigCtx,
            uiScanIdx,
uiPosY, uiPosX, blockType, uiWidth, uiHeight, eTType );
```

```
    else
        uiCtxSig = TComTrQuant::getSigCtxInc( patternSigCtx,
            uiScanIdx,
uiPosX, uiPosY, blockType, uiWidth, uiHeight, eTType );
}
```

Indication of Last Nonzero Position

Figure 1:
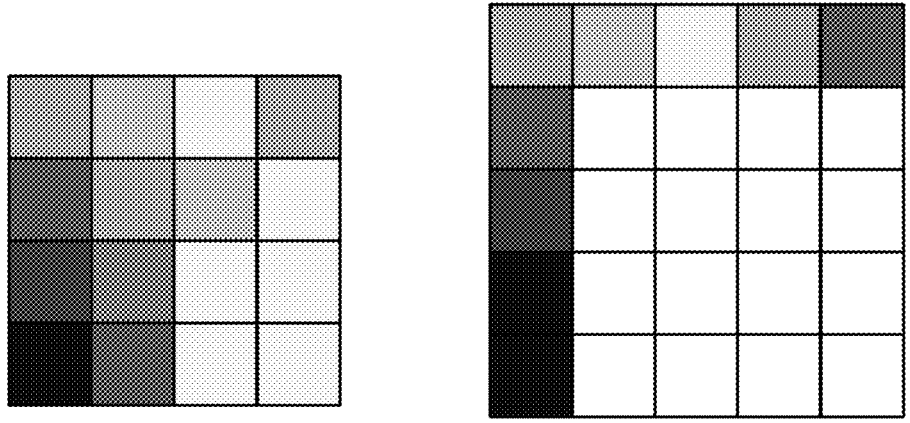
FIG. 1 illustrates an original block (left) that is to be encoded and the surrounding pixels (right), which are already encoded (transmitted).
Figure 2:
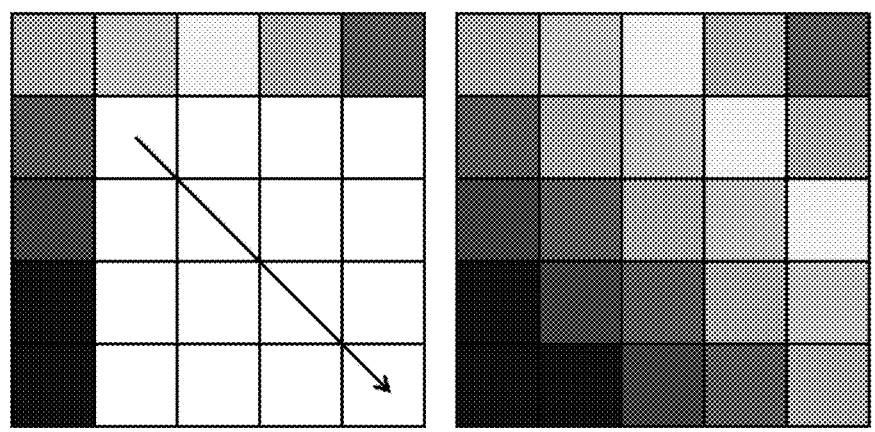
FIG. 2 illustrates (left) a intra prediction direction which is signaled to a decoder, and (right) the decoder predicts the pixels in the area to decode according to the signaled prediction direction.
Figures 3, 4, 5:
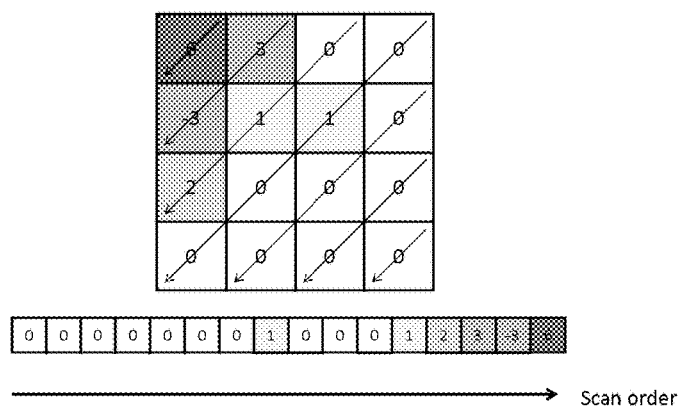
FIG. 3 illustrates the prediction error, residual, between a prediction and an original block.
FIG. 4 illustrates (left) a block after transform and quantization, and (right) a diagonal scanning order.
FIG. 5 illustrates (left) a horizontal scan order, and (right) a vertical scan order.
Figure 6:
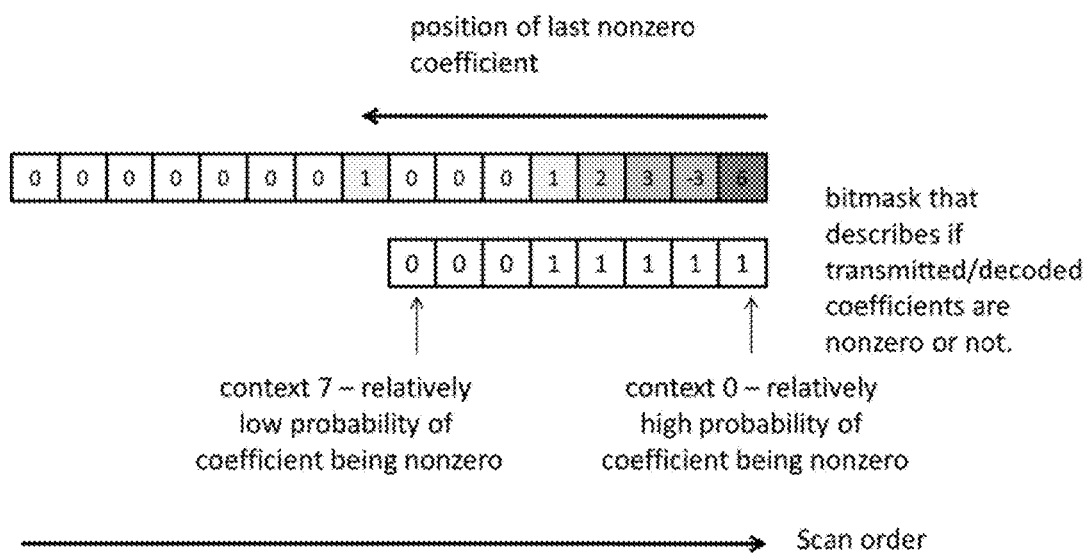
FIG. 6 illustrates encoding/decoding of coefficients.

Previously herein, the signaling of a last nonzero coefficient or residual value was described, e.g. with reference to FIG. 6. Since, for transform skipped blocks, the residual values typically are larger in the beginning of the scan, the last nonzero position is often the position in the bottom right corner of the block, e.g. as illustrated in FIG. 4.

To reduce the overhead for coding the last coefficient position when transform skip is used, the inventors propose to adjust the coding of the last nonzero coefficient position so that it references the bottom right corner of the block instead of the top left corner when transform skip is used. This is shown in the following lines of code:

```
UInt uiBlkPosLast;
if(isTransformSkip)
{
    // transform skip is used
    uiBlkPosLast = 15 - (uiPosLastX +
(uiPosLastY<<uiLog2BlockSize));
}
else
{
    // transform skip is not used
    uiBlkPosLast = uiPosLastX + (uiPosLastY<<uiLog2BlockSize);
}
``` where isTransformSkip indicates if transform skip is used and uiPosLastX and uiPosLastY is the position of the last nonzero coefficient, and where uiPosLastX=0 and uiPosLastY=0 corresponds to the top left of the residual block. uiBlkPosLast is the position of the last nonzero coefficient in the bitmask.

The above described embodiments may be performed by a decoder 1400a and/or an encoder 1400b. The decoder may be configured to receive a bitstream and to decode the bitstream and to perform decoding of transform-skip blocks performing one or more of the embodiments described above.

The decoder 1400a may comprise a processor 1401a configured to perform method steps of the embodiments described above. The decoder may also comprise a memory 1402a. The processor is configured to perform the decoding according to one or more of the embodiments described above.

The processor 1401a is capable of executing software instructions contained in a computer program stored in a computer program product e.g. in the form of a memory 1402a. The respective computer program product can be a memory being any combination of read and write memory (RAM) and read only memory (ROM). The respective memory comprises persistent storage, which, for example, can be any single one or combination of magnetic memory, optical memory, solid state memory or even remotely mounted memory.

The decoder may be a High Efficiency Video Coding, (HEVC) decoder e.g. implemented in a mobile terminal. It should however be noted that the embodiments are not limited to HEVC.

An exemplifying encoder 1400b may be configured to encode a bitstream and to send the bitstream and to perform encoding of transform-skip blocks according to one or more of the embodiments described above. The encoder 1400b may comprise a processor 1401b configured to perform the method steps of the embodiments described above. The encoder may also comprise a memory 1402*b*. The processor is configured to perform the encoding according to one or more of the embodiments described above.

The processor 1401*b* may be capable of executing software instructions contained in a computer program stored in a computer program product e.g. in the form of one or more memories 1402*b*. The respective computer program product can be a memory being any combination of read and write memory (RAM) and read only memory (ROM). The respective memory comprises persistent storage, which, for example, can be any single one or combination of magnetic memory, optical memory, solid state memory or even remotely mounted memory.

The encoder 1400*b* may be a High Efficiency Video Coding, (HEVC) encoder e.g. implemented in a mobile terminal. It should however be noted that the embodiments are not limited to HEVC.

APPENDIX 1

[0100] Below a suggestion related to a HEVC-type coding scheme is disclosed. The suggestion comprises changes to existing texts related to HEVC, such that the solutions previously described in this document is incorporated in said texts and said scheme. Suggested changes to existing texts are underlined.

CONTRIBUTION

Abstract

This contribution presents fixes in the residual coding of transform-skipped blocks to combat the different nature of the transform skip residual compared to transform coefficients: The addressing of the context for the coding of the significance flags are changed, the start-up context model for non-zero coefficient greater than 1 flags is changed and the coding of the reference position for the last coefficient position is modified. The contribution claims that average gains for common conditions (excluding class F) is 0.0%, and that the average BDR gain for class F is 0.8%. By also turning on RDOQ for transform skipped blocks, the contribution claims that the gains become 0.1% (excluding class F) and 1.5% for class F.

The contribution also presents an alternative, namely to invert the scan directions for coding of transform skip blocks. Results are reported both for the case when RDOQ is turned off for transform skipped blocks and when it is turned on. For RDOQ turned off, the contribution reports that the gains for common conditions (excluding class F) is 0.1% and that the average BDR gain for class F is 1.0%. If RDOQ is turned on, the gains are reported to be 0.2% for common conditions (excluding class F), and 1.7% for class F.

The contribution also presents an encoder-only modification to turn on RDOQ for transform skip. The gains are reported to be 0.1% for common conditions (excluding class F) and the average BDR gain for class F is reported to be 0.6%.

Background

Transform skip for intra was introduced in JCTVC-I0408 and for inter in last meeting in JCTVC-J0237.

The transform coefficients are typically larger in the top left corner than in the bottom right. This is considered in the coefficient coding in HEVC.

However when the transform is skipped it is the quantized residual that is coded and the characteristic of that in intra prediction is that the residual typically is larger further away from the reference samples. In inter prediction the residual can appear generally anywhere in the transform skipped block.

At the last meeting there were several proposals to have inverse scan orders for residual coding of intra transform skipped blocks for example JCTVC-J0053. In this proposal an alternative 1 solution is presented which keeps the same scan orders as in HM8.0 but instead adjusts the residual coding to make a better fit when the block to be coded has used transform skip. An alternative 2 solution is also presented that have inverse scan orders for transform skipped blocks.

Alternative 1

Proposed changes to the HEVC text are shown in section 10 (high-lighted in yellow).

Adjustment of coding of last nonzero coefficient position

To reduce the overhead for coding the last coefficient position when transform skip is used it is proposed to adjust the coding of the last coefficient position so that it references the bottom right corner of the block instead of the top left corner when transform skip is used.

Decoder software change (high-lighted in yellow):

```
  UInt uiBlkPosLast;
  if(isTransformSkip)
  {
      uiBlkPosLast     = 15 - (uiPosLastX + (uiPosLastY<<uiLog2BlockSize));
  }
  else
  {
      uiBlkPosLast     = uiPosLastX + (uiPosLastY<<uiLog2BlockSize);
  }
```

Adjustment of context addressing for coding of significant_coeff_flag's

To reduce the overhead for coding of significance flags when transform skip is used it is proposed to use the context for the scan position (3- uiPosX,3- uiPosY) instead of (uiPosX, uiPosY) when transform skip is used.

Decoder software change (high-lighted in yellow):

```
        if(isTransformSkip)
```

```
            uiCtxSig  = TComTrQuant::getSigCtxInc( patternSigCtx,
uiScanIdx, 3-uiPosX, 3-uiPosY, blockType, uiWidth, uiHeight, eTType
);
        else
            uiCtxSig  = TComTrQuant::getSigCtxInc( patternSigCtx,
uiScanIdx, uiPosX, uiPosY, blockType, uiWidth, uiHeight, eTType );
```

Adjustment of context initialization for coding of coeff_abs_level_greater1_flag's To reduce the overhead for coding of coeff_abs_level_greater1_flags it is proposed to initialize the greater1Ctx to 0 when transform skip is used.

Decoder software change (high-lighted in yellow):

```
    if(isTransformSkip&&numNonZero)
    {
        c1 = 0;
    }
    else
    {
        c1 = 1;
    }
        ContextModel *baseCtxMod = ( eTType==TEXT_LUMA ) ?
m_cCUOneSCModel.get( 0, 0 ) + 4 * uiCtxSet : m_cCUOneSCModel.get(
0, 0 ) + NUM_ONE_FLAG_CTX_LUMA + 4 * uiCtxSet;
      for ( Int i = 0; i < numNonZero; i++) absCoeff[i] = 1;
      Int numC1Flag = min(numNonZero, C1FLAG_NUMBER);
      Int firstC2FlagIdx = -1;
```

```
for( Int idx = 0; idx < numC1Flag; idx++ )
{
  m_pcTDecBinIf->decodeBin( uiBin, baseCtxMod[c1] );
  if( uiBin == 1 )
  {
    c1 = 0;
    if (firstC2FlagIdx == -1)
    {
      firstC2FlagIdx = idx;
    }
  }
  else if( (c1 < 3) && (c1 > 0) )
  {
    c1++;
  }
  absCoeff[ idx ] = uiBin + 1;
}
```

Results

Table 1 Anchor HM8.0 versus Alternative 1 with RDOQ turned on for transform skipped blocks.

|  | All Intra Main | | | All Intra HE10 | | |
| --- | --- | --- | --- | --- | --- | --- |
|  | Y | U | V | Y | U | V |
| Class A | 0,0% | 0,0% | 0,0% | 0,0% | 0,0% | 0,0% |
| Class B | 0,0% | 0,0% | 0,0% | 0,0% | 0,0% | 0,0% |
| Class C | -0,1% | -0,1% | -0,1% | -0,1% | -0,1% | -0,1% |
| Class D | -0,1% | 0,0% | -0,1% | -0,1% | 0,0% | -0,1% |
| Class E | 0,0% | 0,0% | 0,0% | 0,0% | 0,0% | 0,0% |
| Overall | 0,0% | 0,0% | 0,0% | 0,0% | 0,0% | 0,0% |
|  | 0,0% | 0,0% | 0,0% | 0,0% | 0,0% | 0,0% |
| Class F | -1,6% | -1,7% | -2,1% | -1,6% | -1,7% | -2,2% |
| Enc Time[%] | 105% | | | 100% | | |
| Dec Time[%] | 104% | | | 98% | | |

|  | Random Access Main | | | Random Access HE10 | | |
| --- | --- | --- | --- | --- | --- | --- |
|  | Y | U | V | Y | U | V |
| Class A | 0,0% | -0,2% | -0,2% | 0,0% | 0,1% | -0,1% |
| Class B | 0,0% | 0,1% | 0,2% | 0,0% | 0,1% | 0,2% |
| Class C | -0,2% | -0,2% | 0,0% | -0,2% | -0,3% | -0,4% |
| Class D | -0,2% | -0,3% | -0,3% | -0,3% | -0,2% | -0,4% |
| Class E | | | | | | |
| Overall | -0,1% | -0,1% | -0,1% | -0,1% | 0,0% | -0,2% |
|  | -0,1% | -0,2% | -0,1% | -0,1% | -0,1% | -0,2% |
| Class F | -1,6% | -1,5% | -2,1% | -1,5% | -1,3% | -2,2% |
| Enc Time[%] | 102% | | | 102% | | |
| Dec Time[%] | 100% | | | 99% | | |

|  | Low delay B Main | | | Low delay B HE10 | | |
|---|---|---|---|---|---|---|
|  | Y | U | V | Y | U | V |
| Class A | | | | | | |
| Class B | 0,0% | 0,1% | 0,2% | 0,0% | 0,0% | 0,3% |
| Class C | -0,1% | 0,0% | 0,1% | -0,2% | 0,3% | 0,2% |
| Class D | -0,3% | 0,0% | -0,4% | -0,2% | -0,4% | 0,1% |
| Class E | 0,1% | -0,3% | 0,1% | 0,1% | 0,9% | -1,2% |
| Overall | -0,1% | 0,0% | 0,0% | -0,1% | 0,1% | -0,1% |
|  | -0,1% | 0,0% | -0,1% | -0,1% | 0,1% | -0,1% |
| Class F | -1,3% | -0,9% | -1,2% | -1,5% | -0,7% | -3,1% |
| Enc Time[%] | 101% | | | 102% | | |
| Dec Time[%] | 102% | | | 100% | | |

|  | Y | U | V |
|---|---|---|---|
| Avg exl classF | -0,1% | 0,0% | -0,1% |
| Avg class F | -1,5% | -1,3% | -2,2% |

Table 2 Anchor HM8.0 versus Alternative 1 with RDOQ turned off for transform skipped blocks.

|  | All Intra Main | | | All Intra HE10 | | |
|---|---|---|---|---|---|---|
|  | Y | U | V | Y | U | V |
| Class A | 0,0% | 0,0% | 0,0% | 0,0% | 0,0% | 0,1% |
| Class B | 0,0% | 0,0% | 0,0% | 0,0% | 0,0% | 0,0% |
| Class C | -0,1% | 0,0% | 0,0% | -0,1% | 0,0% | 0,0% |
| Class D | 0,0% | 0,0% | 0,0% | 0,0% | 0,0% | 0,0% |
| Class E | 0,0% | 0,0% | 0,0% | 0,0% | 0,0% | 0,0% |
| Overall | 0,0% | 0,0% | 0,0% | 0,0% | 0,0% | 0,0% |
|  | 0,0% | 0,0% | 0,0% | 0,0% | 0,0% | 0,0% |
| Class F | -1,1% | -1,0% | -1,5% | -1,1% | -1,0% | -1,5% |
| Enc Time[%] | 98% | | | 96% | | |
| Dec Time[%] | 106% | | | 102% | | |

|  | Random Access Main | | | Random Access HE10 | | |
|---|---|---|---|---|---|---|
|  | Y | U | V | Y | U | V |
| Class A | 0,0% | 0,0% | 0,0% | 0,0% | 0,2% | 0,1% |
| Class B | 0,0% | 0,0% | 0,1% | 0,0% | 0,1% | 0,1% |
| Class C | 0,0% | 0,0% | 0,0% | -0,1% | -0,1% | -0,2% |
| Class D | 0,0% | 0,0% | -0,2% | -0,1% | 0,0% | -0,3% |
| Class E | | | | | | |
| Overall | 0,0% | 0,0% | 0,0% | 0,0% | 0,0% | -0,1% |
|  | 0,0% | 0,0% | -0,1% | 0,0% | 0,0% | -0,1% |
| Class F | -0,8% | -0,6% | -1,1% | -0,7% | -0,4% | -1,2% |
| Enc Time[%] | 99% | | | 100% | | |
| Dec Time[%] | 100% | | | 97% | | |

|  | Low delay B Main | | | Low delay B HE10 | | |
|---|---|---|---|---|---|---|
|  | Y | U | V | Y | U | V |

| Class A | | | | | | |
|---|---|---|---|---|---|---|
| Class B | 0,0% | 0,2% | 0,0% | 0,0% | 0,0% | 0,3% |
| Class C | 0,0% | 0,1% | 0,2% | -0,1% | 0,1% | 0,5% |
| Class D | -0,1% | 1,1% | -0,6% | 0,0% | -0,5% | -0,2% |
| Class E | 0,0% | -0,1% | -0,1% | 0,0% | 0,6% | -0,5% |
| Overall | 0,0% | 0,3% | -0,1% | 0,0% | 0,0% | 0,1% |
| | 0,0% | 0,3% | -0,1% | 0,0% | 0,0% | 0,0% |
| Class F | -0,6% | 0,0% | -1,1% | -0,7% | -0,1% | -1,8% |
| Enc Time[%] | | 99% | | | 99% | |
| Dec Time[%] | | 98% | | | 97% | |

| | Y | U | V |
|---|---|---|---|
| Avg exl classF | 0,0% | 0,1% | 0,0% |
| Avg class F | -0,8% | -0,5% | -1,4% |

Alternative 2

Inverse scan for both intra and inter transform skipped blocks. Proposed changes to the HEVC text is shown in section 11 (high-lighted in yellow).

Table 3 Anchor HM8.0 versus Alternative 2 with RDOQ turned on for transform skipped blocks.

|  | All Intra Main | | | All Intra HE10 | | |
| --- | --- | --- | --- | --- | --- | --- |
|  | Y | U | V | Y | U | V |
| Class A | 0,0% | 0,0% | 0,0% | 0,0% | 0,0% | 0,0% |
| Class B | 0,0% | -0,1% | -0,1% | 0,0% | -0,1% | -0,1% |
| Class C | -0,3% | -0,3% | -0,3% | -0,3% | -0,3% | -0,4% |
| Class D | -0,4% | -0,4% | -0,6% | -0,4% | -0,5% | -0,6% |
| Class E | -0,2% | -0,1% | -0,1% | -0,2% | -0,1% | -0,1% |
| Overall | -0,2% | -0,2% | -0,2% | -0,2% | -0,2% | -0,2% |
|  | -0,2% | -0,2% | -0,2% | -0,2% | -0,2% | -0,2% |
| Class F | -1,9% | -2,2% | -2,4% | -1,9% | -2,3% | -2,4% |
| Enc Time[%] | 97% | | | 79% | | |
| Dec Time[%] | 91% | | | 68% | | |

|  | Random Access Main | | | Random Access HE10 | | |
| --- | --- | --- | --- | --- | --- | --- |
|  | Y | U | V | Y | U | V |
| Class A | 0,0% | -0,4% | -0,3% | 0,0% | -0,1% | -0,2% |
| Class B | 0,0% | -0,1% | 0,1% | 0,0% | 0,0% | -0,1% |
| Class C | -0,3% | -0,5% | -0,4% | -0,3% | -0,4% | -0,6% |
| Class D | -0,4% | -0,7% | -0,7% | -0,5% | -0,8% | -0,9% |
| Class E |  |  |  |  |  |  |
| Overall | -0,2% | -0,4% | -0,3% | -0,2% | -0,3% | -0,4% |
|  | -0,2% | -0,4% | -0,3% | -0,2% | -0,4% | -0,4% |
| Class F | -1,8% | -2,2% | -2,3% | -1,8% | -2,0% | -2,3% |
| Enc Time[%] | 95% | | | 84% | | |

| | | |
|---|---|---|
| Dec Time[%] | 89% | 71% |

| | Low delay B Main | | | Low delay B HE10 | | |
|---|---|---|---|---|---|---|
| | Y | U | V | Y | U | V |
| Class A | | | | | | |
| Class B | 0,0% | 0,2% | 0,1% | 0,0% | -0,3% | 0,1% |
| Class C | -0,2% | -0,3% | -0,2% | -0,2% | 0,0% | 0,2% |
| Class D | -0,3% | -0,2% | -0,8% | -0,2% | -0,7% | -0,3% |
| Class E | -0,1% | 0,3% | 0,2% | -0,3% | 0,1% | -0,6% |
| Overall | -0,1% | 0,0% | -0,2% | -0,1% | -0,3% | -0,1% |
| | -0,1% | 0,0% | -0,2% | -0,1% | -0,3% | -0,1% |
| Class F | -1,3% | -1,3% | -1,6% | -1,4% | -1,2% | -1,5% |
| Enc Time[%] | 96% | | | 82% | | |
| Dec Time[%] | 89% | | | 73% | | |

| | Y | U | V |
|---|---|---|---|
| Avg exl classF | -0,2% | -0,2% | -0,2% |
| Avg class F | -1,7% | -1,8% | -2,1% |

Table 4 Anchor HM8.0 versus Alternative 2 with RDOQ turned off for transform skipped blocks

| | All Intra Main | | | All Intra HE10 | | |
|---|---|---|---|---|---|---|
| | Y | U | V | Y | U | V |
| Class A | 0,0% | 0,0% | 0,0% | 0,0% | 0,0% | 0,0% |
| Class B | 0,0% | -0,1% | -0,1% | 0,0% | 0,0% | 0,0% |
| Class C | -0,3% | -0,2% | -0,3% | -0,2% | -0,2% | -0,3% |
| Class D | -0,4% | -0,4% | -0,5% | -0,3% | -0,3% | -0,4% |

|  |  |  |  |  |  |  |
|---|---|---|---|---|---|---|
| Class E | -0,1% | 0,0% | 0,0% | -0,1% | 0,0% | -0,1% |
| Overall | -0,2% | -0,1% | -0,2% | -0,2% | -0,1% | -0,1% |
|  | -0,2% | -0,1% | -0,2% | -0,2% | -0,1% | -0,2% |
| Class F | -1,4% | -1,5% | -1,7% | -1,4% | -1,6% | -1,8% |
| Enc Time[%] | 97% | | | 92% | | |
| Dec Time[%] | 102% | | | 85% | | |

|  | Random Access Main | | | Random Access HE10 | | |
|---|---|---|---|---|---|---|
|  | Y | U | V | Y | U | V |
| Class A | 0,0% | -0,3% | 0,0% | -0,1% | 0,0% | -0,3% |
| Class B | 0,0% | -0,2% | 0,1% | 0,0% | -0,1% | 0,1% |
| Class C | -0,1% | -0,3% | -0,1% | -0,2% | -0,3% | -0,6% |
| Class D | -0,2% | -0,4% | -0,7% | -0,2% | -0,4% | -0,9% |
| Class E | | | | | | |
| Overall | -0,1% | -0,3% | -0,2% | -0,1% | -0,2% | -0,4% |
|  | -0,1% | -0,3% | -0,2% | -0,1% | -0,2% | -0,3% |
| Class F | -1,0% | -1,1% | -1,2% | -0,9% | -1,1% | -1,3% |
| Enc Time[%] | 97% | | | 97% | | |
| Dec Time[%] | 88% | | | 86% | | |

|  | Low delay B Main | | | Low delay B HE10 | | |
|---|---|---|---|---|---|---|
|  | Y | U | V | Y | U | V |
| Class A | | | | | | |
| Class B | 0,0% | 0,2% | 0,0% | 0,0% | -0,1% | -0,3% |
| Class C | 0,0% | -0,1% | -0,1% | -0,1% | -0,2% | -0,2% |
| Class D | -0,1% | 0,1% | -0,2% | 0,0% | -0,4% | -0,1% |
| Class E | -0,1% | 0,1% | 0,0% | -0,2% | 0,4% | -0,8% |
| Overall | 0,0% | 0,1% | -0,1% | -0,1% | -0,1% | -0,3% |
|  | 0,0% | 0,1% | -0,1% | -0,1% | -0,1% | -0,4% |
| Class F | -0,5% | -0,6% | -0,8% | -0,6% | -0,6% | -1,3% |

| | | |
|---|---|---|
| Enc Time[%] | 98% | 94% |
| Dec Time[%] | 91% | 87% |

| | Y | U | V |
|---|---|---|---|
| Avg exl classF | -0,1% | -0,1% | -0,2% |
| Avg class F | -1,0% | -1,1% | -1,3% |

Encoder only modification to turn on RDOQ for transform skip

RDOQ is a useful tool for bitrate reduction in residual coding but is not used for transform skip in HM-8.0. Here we show the effect of turning on RDOQ for transform skip.

Table 5 Anchor HM8.0 versus RDOQ turned on for transform skipped blocks

| | All Intra Main | | | All Intra HE10 | | |
|---|---|---|---|---|---|---|
| | Y | U | V | Y | U | V |
| Class A | 0,0% | 0,0% | 0,0% | 0,0% | 0,0% | 0,0% |
| Class B | 0,0% | 0,0% | 0,0% | 0,0% | 0,0% | 0,0% |
| Class C | 0,0% | 0,0% | 0,0% | 0,0% | 0,0% | 0,0% |
| Class D | 0,0% | 0,0% | 0,0% | 0,0% | 0,0% | 0,0% |
| Class E | 0,0% | 0,0% | 0,0% | 0,0% | 0,0% | 0,0% |
| Overall | 0,0% | 0,0% | 0,0% | 0,0% | 0,0% | 0,0% |
| | 0,0% | 0,0% | 0,0% | 0,0% | 0,0% | 0,0% |
| Class F | -0,4% | -0,5% | -0,6% | -0,3% | -0,5% | -0,5% |
| Enc Time[%] | | 95% | | | 81% | |
| Dec Time[%] | | 89% | | | 70% | |

|  | Random Access Main | | | Random Access HE10 | | |
|---|---|---|---|---|---|---|
|  | Y | U | V | Y | U | V |
| Class A | 0,1% | -0,1% | -0,1% | 0,0% | -0,1% | -0,4% |
| Class B | 0,0% | 0,0% | 0,1% | 0,0% | 0,0% | 0,1% |
| Class C | -0,1% | -0,1% | 0,0% | -0,1% | 0,0% | -0,1% |
| Class D | -0,2% | 0,0% | -0,1% | -0,2% | 0,0% | 0,0% |
| Class E |  |  |  |  |  |  |
| Overall | 0,0% | -0,1% | 0,0% | -0,1% | 0,0% | -0,1% |
|  | 0,0% | -0,1% | 0,0% | -0,1% | 0,0% | -0,1% |
| Class F | -0,8% | -0,9% | -0,9% | -0,7% | -0,7% | -0,8% |
| Enc Time[%] | 93% | | | 84% | | |
| Dec Time[%] | 84% | | | 72% | | |

|  | Low delay B Main | | | Low delay B HE10 | | |
|---|---|---|---|---|---|---|
|  | Y | U | V | Y | U | V |
| Class A |  |  |  |  |  |  |
| Class B | 0,1% | 0,1% | -0,3% | 0,0% | 0,0% | 0,1% |
| Class C | -0,1% | 0,0% | 0,1% | -0,2% | 0,1% | 0,2% |
| Class D | -0,3% | -0,2% | -0,5% | -0,2% | -0,5% | -0,6% |
| Class E | 0,0% | 0,1% | 0,9% | -0,1% | -0,2% | 0,2% |
| Overall | -0,1% | 0,0% | 0,0% | -0,1% | -0,1% | 0,0% |
|  | -0,1% | 0,0% | -0,1% | -0,1% | -0,2% | -0,1% |
| Class F | -0,7% | -0,4% | -0,9% | -0,9% | 0,2% | -2,1% |
| Enc Time[%] | 94% | | | 82% | | |
| Dec Time[%] | 89% | | | 73% | | |

|  | Y | U | V |
|---|---|---|---|
| Avg exl classF | -0,1% | 0,0% | 0,0% |
| Avg class F | -0,6% | -0,5% | -1,0% |

Conclusions

The contribution has shown two alternatives to fix the coding of residual of transform skipped blocks given that the typical appearance of the residuals is different from transform coded residual. Both approaches improves coding efficiency of class F sequences where transform skip is used frequently.

Alternative 1 shows that it is possible without inverse of the scan directions but only minor fixes of the residual coding.

It is therefore proposed to adopt one of the alternatives to have a residual coding design that also manage transform skip residual adequately and to turn on RDOQ for transform skipped blocks.

Proposed text modifications alternative 1 last_significant_coeff_x_suffix specifies the suffix of the column position of the last significant coefficient in scanning order within a transform block. The values of last_significant_coeff_x_suffix shall be in the range from 0 to
( 1 << ( ( last_significant_coeff_x_prefix >> 1 ) – 1 ) ) – 1, inclusive.

The column position of the last significant coefficient in scanning order within a transform block LastSignificantCoeffX is derived as follows <u>where the array indices x0, y0 specify the location ( x0, y0 ) of the top-left luma sample of the considered transform block relative to the top-left luma sample of the picture and cIdx specifies an indicator for the colour component.</u>

– If last_significant_coeff_x_suffix is not present, the following applies.

<u>If transform_skip_flag[x0][y0][cIdx]</u>

LastSignificantCoeffX = 3−last_significant_coeff_x_prefix    (0-1)

Otherwise

LastSignificantCoeffX = last_significant_coeff_x_prefix    (0-2)

– Otherwise (last_significant_coeff_x_suffix is present), the following applies.

LastSignificantCoeffX = (1 << ((last_significant_coeff_x_prefix >> 1) − 1)) *

(2 + (last_significant_coeff_x_prefix & 1)) +    (0-3)

last_significant_coeff_x_suffix last_significant_coeff_y_suffix specifies the suffix of the row position of the last significant coefficient in scanning order within a transform block. The values of last_significant_coeff_y_suffix shall be in the range from 0 to ( 1 << ( ( last_significant_coeff_y_prefix >> 1 ) − 1 ) ) − 1, inclusive.

The row position of the last significant coefficient in scanning order within a transform block LastSignificantCoeffY is derived as follows where the array indices x0, y0 specify the location ( x0, y0 ) of the top-left luma sample of the considered transform block relative to the top-left luma sample of the picture and cIdx specifies an indicator for the colour component.

– If last_significant_coeff_y_suffix is not present, the following applies.

if(transform_skip_flag[x0][y0][cIdx])

LastSignificantCoeffY = 3−last_significant_coeff_y_prefix    (0-4)

Otherwise

LastSignificantCoeffY = last_significant_coeff_y_prefix    (0-5)

– Otherwise (last_significant_coeff_y_suffix is present), the following applies.

LastSignificantCoeffY = (1 << ((last_significant_coeff_y_prefix >> 1) − 1)) *

(2 + (last_significant_coeff_y_prefix & 1)) +    (0-6)

last_significant_coeff_y_suffix

When scanIdx is equal to 2, the coordinates are swapped as follows.

( LastSignificantCoeffX, LastSignificantCoeffY ) = Swap( LastSignificantCoeffX, LastSignificantCoeffY )  (0-7)

9.3.3.1.4 Derivation process of ctxIdxInc for the syntax element significant_coeff_flag Inputs to this process are the colour component index cIdx, the current coefficient scan position ( xC, yC ), the scan order index scanIdx, the transform block size log2TrafoSize, <u>the current block position ( x0, y0 ) and the colour component index cIdx.</u>

Output of this process is ctxIdxInc.

The variable sigCtx depends on the current position ( xC, yC ), the colour component index cIdx, the transform block size and previsously decoded bins of the syntax element coded_sub_block_flag. For the derivation of sigCtx, the following applies.

– If log2TrafoSize is equal to 2, sigCtx is derived using ctxIdxMap[ ] specified in Error! Reference source not found. as follows..

<u>If(transform_skip_flag[x0][y0][cIdx])</u>

<u>sigCtx = ctxIdxMap[ ((3−yC) << 2) + 3−xC ]  (0-8)</u>

<u>Otherwise</u> sigCtx = ctxIdxMap[ (yC << 2) + xC ]  (0-9)

– Otherwise, if xC + yC is equal to 0, sigCtx is derived as follows.

sigCtx = 0  (0-10)

– Otherwise, sigCtx is derived using previous values of coded_sub_block_flag as follows.

- The horizontal and vertical sub-block positions xS and yS are set equal to (xC >> 2) and (yC >> 2), respectively.

- The variable prevCsbf is set equal to 0.

- When xS is less than ( 1 << log2TrafoSize − 2 ) − 1, the following applies.

prevCsbf += coded_sub_block_flag[ xS + 1 ][ yS ]     (0-11)

- When yS is less than ( 1 << log2TrafoSize ) − 1, the following applies.

prevCsbf += (coded_sub_block_flag[ xS ][ yS + 1 ] << 1)     (0-12)

- The inner sub-block positions xP and yP are set equal to ( xC & 3 ) and ( yC & 3 ), respectively.

- The variable sigCtx is derived as follows.

a. If prevCsbf is equal to 0, the the following applies.

sigCtx = ( xP + yP == 0 ) ? 2 : ( xP + yP < 3 ) ? 1 : 0     (0-13)

b. Otherwise, if prevCsbf is equal to 1, the following applies.

sigCtx = ( yP == 0 ) ? 2 : ( yP == 1 ) ? 1 : 0     (0-14)

c. Otherwise, if prevCsbf is equal to 2, the following applies.

sigCtx = ( xP == 0 ) ? 2 : ( xP == 1 ) ? 1 : 0     (0-15)

d. Otherwise ( prevCsbf is equal to 3 ), the following applies.

sigCtx = 2     (0-16)

- The variable sigCtx is modified as follows.

e. If cIdx is equal to 0, the following applies.

- When ( xS + yS ) is greater than 0, the following applies.

sigCtx += 3     (0-17)

- The variable sigCtx is modified as follows.

f. If log2TrafoSize is equal to 3, the following applies.

sigCtx += ( scanIdx == 0 ) ? 9 : 15     (0-18)

g. Otherwise, the following applies.

$$\text{sigCtx} \mathrel{+}= 21 \qquad (0\text{-}19)$$

h. Otherwise (cIdx is greater than 0), the following applies.

- If log2TrafoSize is equal to 3, the following applies.

$$\text{sigCtx} \mathrel{+}= 9 \qquad (0\text{-}20)$$

- Otherwise, the following applies.

$$\text{sigCtx} \mathrel{+}= 12 \qquad (0\text{-}21)$$

The context index increment ctxIdxInc is derived using the colour component index cIdx and sigCtx as follows.

- If cIdx is equal to 0, ctxIdxInc is derived as follows.

$$\text{ctxIdxInc} = \text{sigCtx} \qquad (0\text{-}22)$$

- Otherwise (cIdx is greater than 0), ctxIdxInc is derived as follows.

$$\text{ctxIdxInc} = 27 + \text{sigCtx} \qquad (0\text{-}23)$$

Table 0-1 – Specifcation of ctxIdxMap[ i ]

| i | 0 | 1 | 2 | 3 | 4 | 5 | 6 | 7 | 8 | 9 | 10 | 11 | 12 | 13 | 14 |
|---|---|---|---|---|---|---|---|---|---|---|----|----|----|----|----|
| ctxIdxMap[ i ] | 0 | 1 | 4 | 5 | 2 | 3 | 4 | 5 | 6 | 6 | 8 | 8 | 7 | 7 | 8 |

9.3.3.1.5 Derivation process of ctxIdxInc for the syntax element coeff_abs_level_greater1_flag Inputs to this process are the colour component index cIdx, the current block position ( x0, y0 ), the current sub-block scan index i and the current coefficient scan index n within the current sub-block.

Output of this process is ctxIdxInc.

The variable ctxSet specifies the current context set and for its derivation the following applies.

– If this process is invoked for the first time for the current sub-block scan index i, the following applies.

– The variable ctxSet is initialized as follows.

– If the current sub-block scan index i is equal to 0 or cIdx is greater than 0, the following applies.

$$ctxSet = 0 \qquad (0\text{-}24)$$

– Otherwise (i is greater than 0 and cIdx is equal to 0), the following applies.

$$ctxSet = 2 \qquad (0\text{-}25)$$

– The variable lastGreater1Ctx is derived as follows.

– If the current sub-block with scan index i is the first one to be processed in this subclause for the current transform block, the variable lastGreater1Ctx is set equal to 0.

– Otherwise, the variable lastGreater1Ctx is set equal to the value of greater1Ctx that has been derived during the last invocation of the process specified in this subclause for the syntax element coeff_abs_greater1_flag for the previous sub-block with scan index i + 1.

– When lastGreater1Ctx is equal to 0, ctxSet is incremented by one as follows.

$$ctxSet = ctxSet + 1 \qquad (0\text{-}26)$$

– <u>The variable greater1Ctx is initialized as follows.</u>

– <u>If transform_skip_flag[x0][y0][cIdx] is equal to 1</u>

<u>The variable greater1Ctx is set equal to 0.</u>

– Otherwise

The variable greater1Ctx is set equal to 1.

– Otherwise (this process is not invoked for the first time for the current sub-block scan index i), the following applies.

- The variable ctxSet is set equal to the variable ctxSet that has been derived during the last invocation of the process specified in this subclause.

- The variable greater1Ctx is set equal to the variable greater1Ctx that has been derived during the last invocation of the process specified in this subclause.

- When greater1Ctx is greater than 0, the variable lastGreater1Flag is set equal to the syntax element coeff_abs_level_greater1_flag that has been used during the last invocation of the process specified in this subclause and greater1Ctx is modifed as follows.

– If lastGreater1Flag is equal to 1, greater1Ctx is set equal to 0.

– Otherwise (lastGreater1Flag is equal to 0), greater1Ctx is incremented by 1.

The context index increment ctxIdxInc is derived using the current context set ctxSet and the current context greater1Ctx as follows.

$$ctxIdxInc = ( ctxSet * 4 ) + Min( 3, greater1Ctx ) \qquad (0\text{-}27)$$

When cIdx is greater than 0, ctxIdxInc is modified as follows.

$$ctxIdxInc = ctxIdxInc + 16 \qquad (0\text{-}28)$$

Proposed text modifications alternative 2

The (nT)x(nT) array of residual samples r is derived as specified as follows:

If cu_transquant_bypass_flag is equal to 1, the (nT)x(nT) array r is set equal to the (nT)x(nT) array of transform coefficients TransCoeffLevel[ xT ][ yT ][ cIdx ].

Otherwise, the following ordered steps apply:

1. The scaling process for transform coefficients as specified in subclause Error! Reference source not found. is invoked with the transform block location ( xT, yT ), the size of the transform block nT, the (nT)x(nT) array of transform coefficients, the chroma component variable cIdx and the quantization parameter qP as the inputs and the output is a (nT)x(nT) array of scaled transform coefficients d.

2. The (nT)x(nT) array of residual samples r is derived as follows.

If transform_skip_flag[ xT ][ yT ][ cIdx ] is equal to 1, the residual sample array values r[ x ][ y ] with x = 0..nT − 1, y = 0..nT − 1 are derived as:

r[ x ][ y ] = ( d[nT-1-x ][ nT-1-y ] << 7 ) (8 243)

What is claimed is:

1. A method performed by a video decoder, operable according to a video decoding scheme applying residual decoding comprising use of a context model for deriving contexts to be used for decoding flags, in a bitmask, which flags indicate, respectively, whether an absolute value of a non-zero transform coefficients in a transformed residual block is greater than one, where the context model comprises a plurality of states, each state corresponding to a context and a probability, where a procedure for deriving contexts for a number of flags related to transform coefficients is started in a first state, A, and where, after decoding a flag which corresponds to an absolute value of a transform coefficient that is greater than one, the context model goes to a second state, D, which is used for decoding remaining flags in said bitmask, the method comprising:

for a transform-skipped residual block comprising residual values and not transform coefficients, deriving contexts to be used for decoding flags, in a bitmask, that indicate, respectively, whether an absolute value of a non-zero residual value in the transform-skipped block is greater than one, by use of the context model, starting in the second state D; and decoding the flags in the bitmask, for the transform-skipped residual block, using the derived contexts.

2. The method of claim 1, wherein the decoding scheme further applies reverse scan order for transform skipped blocks.

3. The method of claim 1, wherein the decoding scheme is an extension of HEVC.

4. A method performed by a video encoder, operable according to a video encoding scheme applying residual encoding comprising use of a context model for associating contexts to flags in a bitmask, which flags indicate, respectively, whether an absolute value of a non-zero transform coefficients in a transformed residual block is greater than one, where the context model comprises a plurality of states, each state corresponding to a context and a probability, where a procedure for deriving contexts to be associated with a number of flags related to transform coefficients is started in a first state, A, and where, after encoding a flag which corresponds to a transform coefficient greater than one, the context model goes to a second state, D, which is used for encoding remaining flags in said bitmask, the method comprising:

for a transform-skipped residual block comprising residual values and not transform coefficients, deriving contexts to be associated with flags in a bit map, which flags indicate, respectively, whether an absolute value of a non-zero residual value in the transform-skipped residual block is greater than one, by use of the context model, starting in the second state D; and encoding the flags in the bit map, for the transform-skipped residual block, using the derived contexts.

5. The method of claim 4, wherein the encoding scheme further applies reverse scan order for transform skipped blocks.

6. The method of claim 4, wherein the encoding scheme is HEVC.

7. A video decoder operable according to a video decoding scheme applying residual decoding comprising use of a context model for deriving contexts to be used for decoding flags in a bitmask, which flags indicate, respectively, whether an absolute value of a non-zero transform coefficients in a transformed residual block is greater than one, where the context model comprises a plurality of states, each state corresponding to a context and a probability, where a procedure for deriving contexts for a number of flags related to transform coefficients is started in a first state, A, and where, after decoding a flag which corresponds to an absolute value of a transform coefficient that is greater than one, the context model goes to a second state, D, which is used for decoding remaining flags in said bitmask;

the video decoder comprising processing means and a memory comprising instructions, which when executed by the processing means cause the video decoder to:

for a transform-skipped residual block comprising residual values and not transform coefficients, derive contexts to be used for decoding flags, in a bitmask, which flags indicate, respectively, whether an absolute value of a non-zero residual value in the transform-skipped block is greater than one, by use of the context model, starting in the second state D; and decode the flags in the bitmask, for the transform-skipped residual block, using the derived contexts.

8. The video decoder of claim 7, wherein the decoding scheme further applies reverse scan order for transform skipped blocks.

9. A user equipment comprising the video decoder of claim 7.

10. A video encoder operable according to a video encoding scheme applying residual encoding comprising use of a context model for associating contexts to flags in a bitmask, which flags indicate, respectively, whether an absolute value of a non-zero transform coefficients in a transformed residual block is greater than one, where the context model comprises a plurality of states, each state corresponding to a context and a probability, where a procedure for deriving contexts to be associated with a number of flags related to transform coefficients is started in a first state, A, and where, after encoding a flag which corresponds to a transform coefficient greater than one, the context model goes to a second state, D, which is used for encoding remaining flags in said bitmask, the video encoder comprising processing means and a memory comprising instructions, which when executed by the processing means cause the video decoder to:

for a transform-skipped residual block comprising residual values and not transform coefficients, derive contexts to be associated with flags in a bitmask, which flags indicate, respectively, whether an absolute value of a non-zero residual value in the transform-skipped residual block is greater than one, by use of the context model, starting in the second state D; and encode the flags in the bit map, for the transform-skipped residual block, using the derived contexts.

11. The video encoder of claim 10, wherein the encoding scheme further applies reverse scan order for transform skipped blocks.

12. A user equipment comprising the video encoder of claim 10.

* * * * *